(12) United States Patent
Weissler et al.

(10) Patent No.: US 10,126,391 B2
(45) Date of Patent: Nov. 13, 2018

(54) REDUCING INTERFERENCE IN A COMBINED ASSEMBLY FOR MRI AND NUCLEAR IMAGING

(71) Applicant: KONINKLIJKE PHILIPS N.V., Eindhoven (NL)

(72) Inventors: Bjoern Weissler, Aachen (DE); Pierre Gebhardt, Aachen (DE); Jacob Adrian Clemens Wehner, Aachen (DE); Volkmar Schulz, Wuerselen (DE)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 355 days.

(21) Appl. No.: 14/905,071

(22) PCT Filed: Jul. 9, 2014

(86) PCT No.: PCT/EP2014/064733
§ 371 (c)(1),
(2) Date: Jan. 14, 2016

(87) PCT Pub. No.: WO2015/007593
PCT Pub. Date: Jan. 22, 2015

(65) Prior Publication Data
US 2016/0161578 A1    Jun. 9, 2016

(30) Foreign Application Priority Data
Jul. 19, 2013 (EP) .................................... 13177179

(51) Int. Cl.
*G01R 33/48* (2006.01)
*G01R 33/56* (2006.01)
(Continued)

(52) U.S. Cl.
CPC .......... *G01R 33/481* (2013.01); *G01R 33/36* (2013.01); *G01R 33/56* (2013.01); *G01T 1/1603* (2013.01); *G01T 1/2985* (2013.01)

(58) Field of Classification Search
CPC ..... G01T 1/1603; G01T 1/2985; G01R 33/36; G01R 33/56
(Continued)

(56) References Cited

U.S. PATENT DOCUMENTS 6,593,575 B2 * 7/2003 Fries ...................... G01T 1/2985
  250/363.02
6,810,124 B1   10/2004 White
(Continued)

FOREIGN PATENT DOCUMENTS

EP    3022572 A1 * 5/2016 ........... G01T 1/1603
EP    3022572 A1 * 5/2016 ........... G01T 1/1603
(Continued)

OTHER PUBLICATIONS

Neves et al., Feasibility and electromagnetic compatibility study of the ClearPEM front-end electronics for simultaneous PET-MR imaging, Nuclear Instruments and Methods in Physics Research A 702, 2013, Copyright 2012 Elseiver B.V.*
(Continued)

Primary Examiner — Dixomara Vargas
Assistant Examiner — Sean Curtis

(57) ABSTRACT

A combined-modality imaging assembly includes a Magnetic Resonance (MR) imaging system and a nuclear imaging system. The nuclear imaging system has a plurality of (M) modules; and the combined imaging assembly includes a timing control unit having a reference clock unit; and at least one of a phase shifting unit and a frequency shifting unit. At least one of the phase shifting unit and the frequency shifting unit is configured to receive a reference clock signal
(Continued)

from the reference clock unit and to generate a plurality of (M) shifted clock signals for clocking the (M) modules such that at least one of the (M) shifted clock signals is shifted respective the reference clock signal in at least one of frequency or phase. In so doing, reduced interference between the modules of the nuclear imaging system and the MR imaging system is obtained.

19 Claims, 12 Drawing Sheets

(51) Int. Cl.
   G01T 1/29      (2006.01)
   G01T 1/16      (2006.01)
   G01R 33/36     (2006.01)
(58) Field of Classification Search
   USPC .................................................. 324/300–322
   See application file for complete search history.

(56) References Cited

U.S. PATENT DOCUMENTS

| | | | | |
|---|---|---|---|---|
| 6,844,732 | B2* | 1/2005 | Carlini | G01R 33/389 |
| | | | | 324/318 |
| 7,061,530 | B2 | 6/2006 | Koyama | |
| 7,323,874 | B2* | 1/2008 | Krieg | G01R 33/481 |
| | | | | 324/318 |
| 7,667,199 | B2* | 2/2010 | Fries | G01R 33/28 |
| | | | | 250/336.1 |
| 8,013,607 | B2* | 9/2011 | DeMeester | G01R 33/28 |
| | | | | 324/318 |
| 8,188,736 | B2* | 5/2012 | Schulz | A61B 6/037 |
| | | | | 324/309 |
| 8,378,677 | B2* | 2/2013 | Morich | G01R 33/3806 |
| | | | | 324/307 |
| 8,467,848 | B2* | 6/2013 | Solf | A61B 6/037 |
| | | | | 600/411 |
| 8,519,710 | B2* | 8/2013 | Schulz | A61B 6/037 |
| | | | | 324/309 |
| 8,525,116 | B2* | 9/2013 | Schulz | G01T 1/1603 |
| | | | | 250/363.02 |
| 8,723,521 | B2* | 5/2014 | Schulz | A61B 6/037 |
| | | | | 324/309 |
| 9,121,893 | B2* | 9/2015 | Schmand | G01R 33/26 |
| 9,134,392 | B2* | 9/2015 | Caruba | G01R 33/481 |
| 9,176,208 | B2* | 11/2015 | Kalechofsky | G01R 33/36 |
| 9,504,851 | B2* | 11/2016 | Franke | G01R 33/4816 |
| 9,554,707 | B2* | 1/2017 | Foo | A61B 5/055 |
| 9,599,731 | B2* | 3/2017 | Schulz | G01T 1/2985 |
| 9,714,995 | B2* | 7/2017 | Kalechofsky | G01R 33/36 |
| 9,866,220 | B2* | 1/2018 | Zhao | H03K 23/005 |
| 2003/0047686 | A1 | 3/2003 | Fries | G01T 1/2985 |
| | | | | 250/363.03 |
| 2006/0038562 | A1* | 2/2006 | Pittaluga | G01R 33/389 |
| | | | | 324/307 |
| 2006/0250133 | A1* | 11/2006 | Krieg | G01R 33/481 |
| | | | | 324/318 |
| 2007/0102641 | A1* | 5/2007 | Schmand | G01R 33/26 |
| | | | | 250/363.03 |
| 2007/0116168 | A1* | 5/2007 | Fries | G01R 33/28 |
| | | | | 375/373 |
| 2008/0137930 | A1* | 6/2008 | Rosen | G06T 11/005 |
| | | | | 382/131 |
| 2008/0208035 | A1* | 8/2008 | Nistler | A61B 6/037 |
| | | | | 600/411 |
| 2008/0265887 | A1* | 10/2008 | Linz | G01R 33/28 |
| | | | | 324/318 |
| 2009/0195249 | A1* | 8/2009 | DeMeester | G01R 33/28 |
| | | | | 324/318 |
| 2010/0188082 | A1* | 7/2010 | Morich | G01R 33/3806 |
| | | | | 324/307 |
| 2010/0217112 | A1* | 8/2010 | Choi | G01R 33/481 |
| | | | | 600/411 |
| 2010/0219347 | A1* | 9/2010 | Schulz | G01T 1/1603 |
| | | | | 250/363.04 |
| 2011/0142316 | A1* | 6/2011 | Wang | G06T 11/006 |
| | | | | 382/131 |
| 2012/0089007 | A1* | 4/2012 | Caruba | G01R 33/481 |
| | | | | 600/411 |
| 2012/0150017 | A1* | 6/2012 | Yamaya | G01R 33/3806 |
| | | | | 600/411 |
| 2013/0234710 | A1* | 9/2013 | Kanno | A61B 5/055 |
| | | | | 324/318 |
| 2014/0005520 | A1* | 1/2014 | Foo | A61B 5/055 |
| | | | | 600/411 |
| 2014/0221816 | A1* | 8/2014 | Franke | G01R 33/4816 |
| | | | | 600/411 |
| 2014/0264041 | A1* | 9/2014 | Schulz | G01T 1/2985 |
| | | | | 250/363.03 |
| 2016/0045112 | A1* | 2/2016 | Weissler | A61B 6/037 |
| | | | | 600/411 |
| 2016/0103194 | A1* | 4/2016 | Schulz | G01R 33/422 |
| | | | | 324/309 |
| 2016/0161578 | A1* | 6/2016 | Weissler | G01T 1/1603 |
| | | | | 324/309 |
| 2017/0163262 | A1* | 6/2017 | Zhao | H03K 23/005 |

FOREIGN PATENT DOCUMENTS

| | | | | |
|---|---|---|---|---|
| JP | 2005034313 | | 2/2005 | |
| WO | 2006080020 | | 8/2006 | |
| WO | 2012060304 | | 10/2012 | |
| WO | WO 2015007593 | A1 * | 1/2015 | ........... G01T 1/1603 |
| WO | WO-2015007593 | A1 * | 1/2015 | ........... G01T 1/1603 |

OTHER PUBLICATIONS

Maramraju, Evaluation of Electromagnetic Interactions between PET and MRI systems for Simultaneous MRI/PET Imaging, Stony Brook University, May 2011. Proquest LLC.*

Ko et al., Simultaneous Multiparametric PET/MRI with Silicon Photomultiplier PET and Ultra-High-Field MRI for Small-Animal Imaging, 2016, Society of Nuclear Medicine and Molecular Imaging, Inc.*

Gebhardt et al., FPGA-based RF interference reduction techniques for simultaneous PET-MRI, 2016 Institute of Physics and Engineering in Medicine.*

Vandenberghe et al., PET-MRI: a review of challenges and solutions in the development of integrated multimodality imaging, 2015 Institute of Physics and Engineering in Medicine.*

Vandenberghe et al., PET-MRI: a review of challenges and solutions in the development of integrated multimodality imaging, 2015 Institute of Physics and Engineering in Medicine. (Year: 2015).*

Neves et al., Feasibility and electromagnetic compatibility study of the ClearPEM front-end electronics for simultaneous PET-MR imaging, Nuclear Instruments and Methods in Physics Research A 702, 2013, Copyright 2012 Elseiver B.V. (Year: 2013).*

Maramraju, Evaluation of Electromagnetic Interactions between PET and MRI systems for Simultaneous MRI/PET Imaging, Stony Brook University, May 2011. Proquest LLC. (Year: 2011).*

Ko et al., Simultaneous Multiparametric PET/MRI with Silicon Photomultiplier PET and Ultra-High-Field MRI for Small-Animal Imaging, 2016, Society of Nuclear Medicine and Molecular Imaging, Inc. (Year: 2016).*

Gebhardt et al., FPGA-based RF interference reduction techniques for simultaneous PET-MRI, 2016 Institute of Physics and Engineering in Medicine. (Year: 2016).*

Sri Harsha Maramraju, et al., "Small animal simultaneous PET/MRI: initial experiences in a 9.4 T microMRI; Small animal simultaneous PET/MRI", Physics in Medicine and Biology, Institute of Physics Publishing, Bristol, GB, vol. 56, No. 8, Mar. 25, 2011.

Zaidi Habib, et al., "An outlook on future design of hybrid PET/MRI systems", Medical Physics, AIP, vol. 38, No. 10, Oct. 1, 2011.

(56) References Cited

OTHER PUBLICATIONS

Schlyer et al., "Preliminary Studies of a Simultaneous PET/MRI Scanner Based on the RatCAP Small Animal Tomograph", Nuclear Science Symposium Conference Record, Oct. 1, 2006.

* cited by examiner

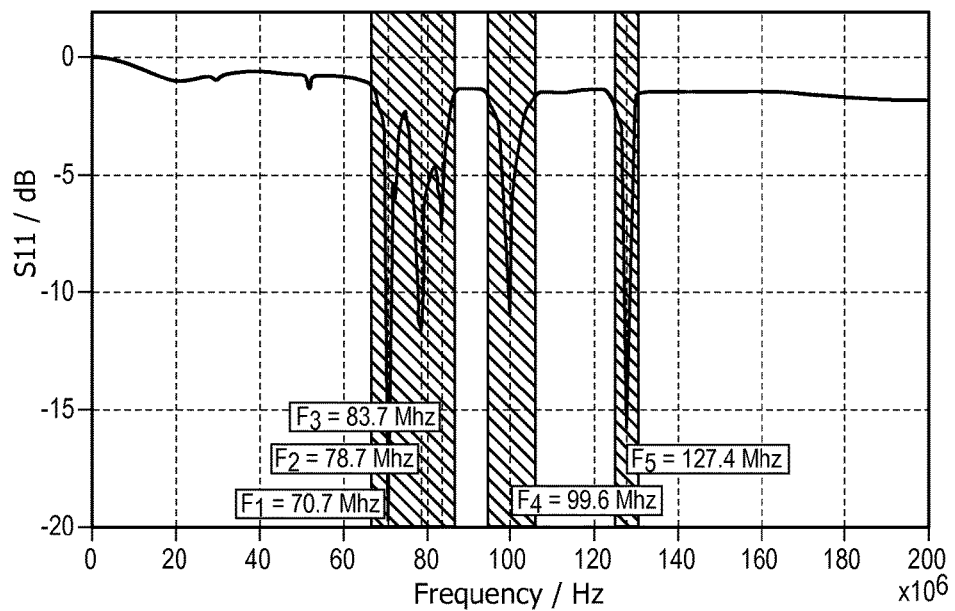
FIG. 2
 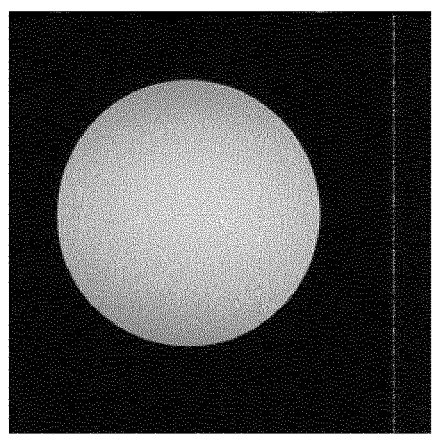
FIG. 3A   FIG. 3B

REDUCING INTERFERENCE IN A COMBINED ASSEMBLY FOR MRI AND NUCLEAR IMAGING

CROSS REFERENCE TO RELATED APPLICATIONS

This application is the U.S. National Phase application under 35 U.S.C. § 371 of International Application No. PCT/EP2014/064733, filed Jul. 9, 2014, published as WO 2015/007593 on Jan. 22, 2015, which claims the benefit of European Patent Application Number 13177179.2 filed Jul. 19, 2013. These applications are hereby incorporated by reference herein.

FIELD OF THE INVENTION

The invention relates to a method and a system for use in a combined-modality imaging assembly that includes a Magnetic Resonance (MR) imaging system and a nuclear imaging system. The invention finds particular application in a combined MR-PET imaging assembly, even more particularly in such imaging assemblies that acquire images simultaneously.

BACKGROUND OF THE INVENTION

In the field of MR imaging the demand for improved medical diagnosis has led to the development of so-called combined-modality imaging assemblies. The combination of an MR imaging system with a nuclear imaging system improves diagnosis by augmenting the soft-tissue image contrast benefits of MR with the functional imaging capabilities of the nuclear imaging system. The nuclear imaging system is typically a PET or a SPECT imaging system and may for example be a whole-body or a pre-clinical imaging system. However the design of combined-modality imaging assemblies is frustrated by interoperability constraints. The few-Tesla magnetic fields and the high RF fields generated within the MR imaging system bore restrict the design freedom in the nuclear imaging system, limiting for example the range of materials that can be used. Furthermore the operation of the two imaging systems in close proximity risks interference from the nuclear imaging system degrading the MR image quality.

Such combined imaging assemblies may be formed through co-location, in which the nuclear imaging system is positioned close to the MR imaging system. During operation, a transfer mechanism such as a patient support pallet is translated between the two imaging systems and the MR and nuclear images are acquired consecutively. The separation between the imaging systems relaxes the impact of one system on the other but risks patient motion between the consecutive acquisitions degrading image quality. Such combined imaging assemblies may also be fully integrated, in which an MR imaging system is combined with a nuclear imaging system in the same housing offering both simultaneous acquisition and a reduction of image artefacts at the expense of aggravated interoperability issues.

A particular interoperability issue found when an MR imaging system is combined with a nuclear imaging system is that of electrical interference between the nuclear imaging system and the MR imaging system. In this, electrical currents flowing in the circuits of the nuclear imaging system produce electromagnetic radiation which risks being detected by the sensitive RF sense coils in the MR imaging system. The problem is particularly acute in simultaneous-acquisition assemblies in which a shared imaging region necessarily requires some parts of the nuclear imaging system to be located close to the bore of the MR imaging system where the sensitive RF coils are located. The RF sense coils are typically sensitive to a particular frequency bandwidth, thus only frequencies within this bandwidth present an issue. However, digital signals commonly used in the nuclear imaging system have an inherently broad RF emission spectral bandwidth which may therefore fall within the detection bandwidth of the MR RF receive coil and thereby interfere with the MR imaging system.

Conventional methods of reducing such interference include the use of electrical screening of the interference-generating regions. Whilst effective, a drawback of their use close to the bore of the MR imaging system is that electrical screening materials can distort the MR magnetic field and thereby degrade the MR image quality. More specifically, eddy currents induced in such a conductive screen soften the time profile of the switching gradient which can lead to a distortion in MR k space.

Other techniques for reducing interference in combined imaging assembly are disclosed in patent application US2009/0195249A1. These include the spectral separation of the RF interference from the magnetic resonance frequency by for example the use of clocking frequencies, and or power supply switching frequencies that are not at the magnetic resonance frequency, or by use of such frequencies which do not have harmonics at the magnetic resonance frequency. The use of notch filters centered at the magnetic resonance frequency and improved shielding is also disclosed in patent application US2009/0195249A1.

Whilst the above-mentioned approaches go some way to reducing interference between a nuclear imaging system and an MR imaging system, the demand for improved quality MR images to further improve patient diagnosis requires this interference to be reduced even further.

SUMMARY OF THE INVENTION

It is an object of the invention to provide a system, a method, and a computer program product for reducing interference between a nuclear imaging system and a nearby MR imaging system.

These objects are achieved by the present invention of a combined imaging assembly comprising an MR imaging system and a nuclear imaging system. The nuclear imaging system includes a plurality of (M) modules, each of which is configured to receive a clock signal. The clock signal may be used for timing and control purposes. The MR imaging system is responsive to signals within a predetermined frequency interval. The combined imaging assembly includes a timing control unit with a reference clock unit; and at least one of a phase shifting unit and a frequency shifting unit. The timing control unit is configured to supply a shifted clock signal to each module in the plurality of (M) modules. In accordance with a first aspect of the invention, at least one of the phase shifting unit and the frequency shifting unit is configured to receive a reference clock signal from the reference clock unit and to generate a plurality of (M) shifted clock signals for clocking the (M) modules such that at least one of the (M) shifted clock signals is shifted respective the reference clock signal in at least one of frequency or phase.

The modules may be for example PET detector modules, or SPECT detector modules. The modules emit RF radiation by virtue of the electrical currents caused by the clock signals that are used to govern their operation. Their position close to the MR imaging system risks causing interference with the MR imaging system. Specifically it is the RF interference within the predetermined frequency interval that is detrimental to the MR imaging system.

Conventionally such a nuclear imaging system is operated from a single reference clock which synchronizes the timing and control of the modules. This enables the timing of events, such as the detection of gamma photons by the modules because all modules are operated at the same clock frequency.

In the present invention the shifted clock signals reduce interference with the MR imaging system because of either or both of i) the spreading of interference frequencies across a range of frequencies, which reduces their spectral density, and ii) the shifting of the interfering frequencies which result from the combination of the clock frequencies to a spectral region outside the predetermined frequency interval to which the MR imaging system is sensitive. The invention arises from the finding that the MR imaging system is sensitive to the combination of the interference from each of the modules. By controlling this combined interference, clock frequencies of the individual modules, in particular their fundamental clock frequencies, that are within the predetermined frequency interval to which the MR imaging system is sensitive can be used to operate the modules because their combined interference has reduced impact upon the MR imaging system.

In accordance with another aspect of the invention, specific orientations of the modules respective the longitudinal axis of main magnet of the MR imaging system are disclosed which have reduced interference with the MR imaging system.

In accordance with another aspect of the invention the MR imaging system includes an MR RF receive coil configured to detect circularly polarized RF radiation respective to the MR imaging system's longitudinal axis. Furthermore the shifted clock signals received by the modules are configured to generate a combined signal with a circularly polarized phase whose direction opposes the phase direction of the circularly polarized RF radiation detected by the MR RF receive coil. In so doing the oppositely-directed circularly polarized interference is not detected by the MR imaging system.

In accordance with another aspect of the invention each of the (M) modules comprises a plurality of neighboring sub-modules. Each sub-module is configured to receive a shifted clock signal which has either a first phase relationship ($\phi_1$) with the reference clock signal or a second phase relationship ($\phi_2$) with the reference clock signal, wherein the first phase relationship is different to the second phase relationship. It is further arranged that nearest neighboring sub-modules each receive a different phase relationship clock signal. In so doing the interference to the MR imaging system is reduced owing to the cancellation of the interference radiated by each of the sub-modules. In a preferred configuration the sub-modules are arranged in a regular two-dimensional array and the modules are operated at the same frequency such that the phase received by each sub-module is either shifted by 0 degrees or 180 degrees respective the reference clock and such that nearest neighboring sub-modules each receive a different phase relationship clock signal. Such a chequerboard spatial distribution of the phase amongst the sub-modules has been found to be particularly advantageous in cancelling the interference from the sub-modules.

In accordance with another aspect of the invention either i) the phase shifting unit is configured to generate a plurality of (M) shifted clock signals which have a temporally-varying pseudo-random mutual phase relationship or ii) the frequency shifting unit is configured to generate a plurality of (M) shifted clock signals which have a temporally-varying pseudo-random mutual frequency relationship. The phrase pseudo-random is intended to mean that the variation is indicative of noise. Algorithm including the Blum Blum Shub, Fortuna, and Mersenne Twister algorithms may be used to generate such a pseudo-random variation. The resulting shifted clock signals cause reduced interference to the MR imaging system because they have a broadening effect on the resulting spectrum, thereby reducing image artefacts. Knowledge of the phase and or frequency shift is also used in other aspects of the invention to determine the timing of events respective the reference clock.

In accordance with another aspect of the invention either i) the phase shifting unit or ii) the frequency shifting unit, is configured to generate a combined interference signal having an anisotropic or a non-rotationally symmetric profile about the MR imaging system longitudinal axis. Such an interference signal may be used to advantageously reduce interference in particularly radially-sensitive directions respective the MR imaging system longitudinal axis.

In accordance with another aspect of the invention, one or more additional RF radiation generation units may be positioned adjacent the (M) modules. The RF radiation generation units are clocked with a shifted clock frequency and cause RF interference which is used to cancel the interference generated by one or more of the modules. In one contemplated configuration a module is substituted for an RF generation unit in order to reduce the overall interference whilst maintaining the mechanical geometry of the combined imaging assembly.

In accordance with another aspect of the invention the reference clock signal has a frequency spectrum and a time domain summation of the plurality of (M) shifted clock signals has a combined frequency spectrum with at least one new spectral component that is not present in the reference clock signal frequency spectrum. In so doing the spectral density of the interference signal is reduced, thereby reducing the interference to the MR imaging system.

In accordance with another aspect of the invention the new spectral component lies outside the predetermined frequency interval. By so positioning the additional spectral component, interference is further reduced by preventing its detection by the MR imaging system.

In accordance with another aspect of the invention a combined imaging assembly is disclosed in which the nuclear imaging system is a PET imaging system and each module is a gamma photon detection module. Each gamma photon detection module further includes a timestamping unit configured to generate timestamps indicative of the time of detection of gamma photons received by the gamma photon detection module respective the shifted clock signal received by that gamma photon detection module. The timing control unit further comprises a timing correction unit configured to receive the timestamps and to determine, for each gamma photon detection module, corrected timestamps indicative of the time of detection of gamma photons based on the reference clock signal and at least one of i) the phase shift of the at least one shifted clock signal and ii) the frequency shift of the at least one shifted clock signal received by that gamma photon detection module. In so doing a corrected timestamp respective a common clock is obtained. This aspect advantageously permits the analysis of coincidence of pairs of gamma photons that are detected by the gamma photon detection modules.

In other aspects of the invention, various method steps are disclosed for reducing interference in the combined MR-nuclear imaging assembly.

In accordance with another aspect of the invention a computer program product comprising instructions which when executed on a processor cause the processor to carry out one or more of the method steps of the invention is disclosed. The computer program product may be a computer-readable storage medium, such as a floppy disc, a magnetic hard drive, a USB drive, an optical disc, ROM or RAM and furthermore the computer executable instructions may be downloadable.

BRIEF DESCRIPTION OF THE FIGURES

FIG. 2 illustrates a mode spectrum of a 12-leg birdcage resonator FIG. 3 illustrates the impact of interference within a sensitive frequency interval of the MR imaging system on MR image quality.

DETAILED DESCRIPTION OF THE INVENTION

In order to reduce interference between a nuclear imaging system and a nearby MR imaging system, the present invention is described with reference to a combined imaging assembly in which the nuclear imaging system is a PET imaging system and the two imaging systems are combined under the same housing, thus fully integrated. It is however to be appreciated that the invention also finds application in MR-nuclear imaging assemblies which are combined in the sense that they are co-located and the interference from the nuclear imaging system affects image quality in the nearby MR imaging system. Such configurations may for example be located in the same room. It is noted that the invention finds application in imaging assemblies that are configured for either whole-body or pre-clinical use. The nuclear imaging system may alternatively be a SPECT imaging system.

Figure 1:
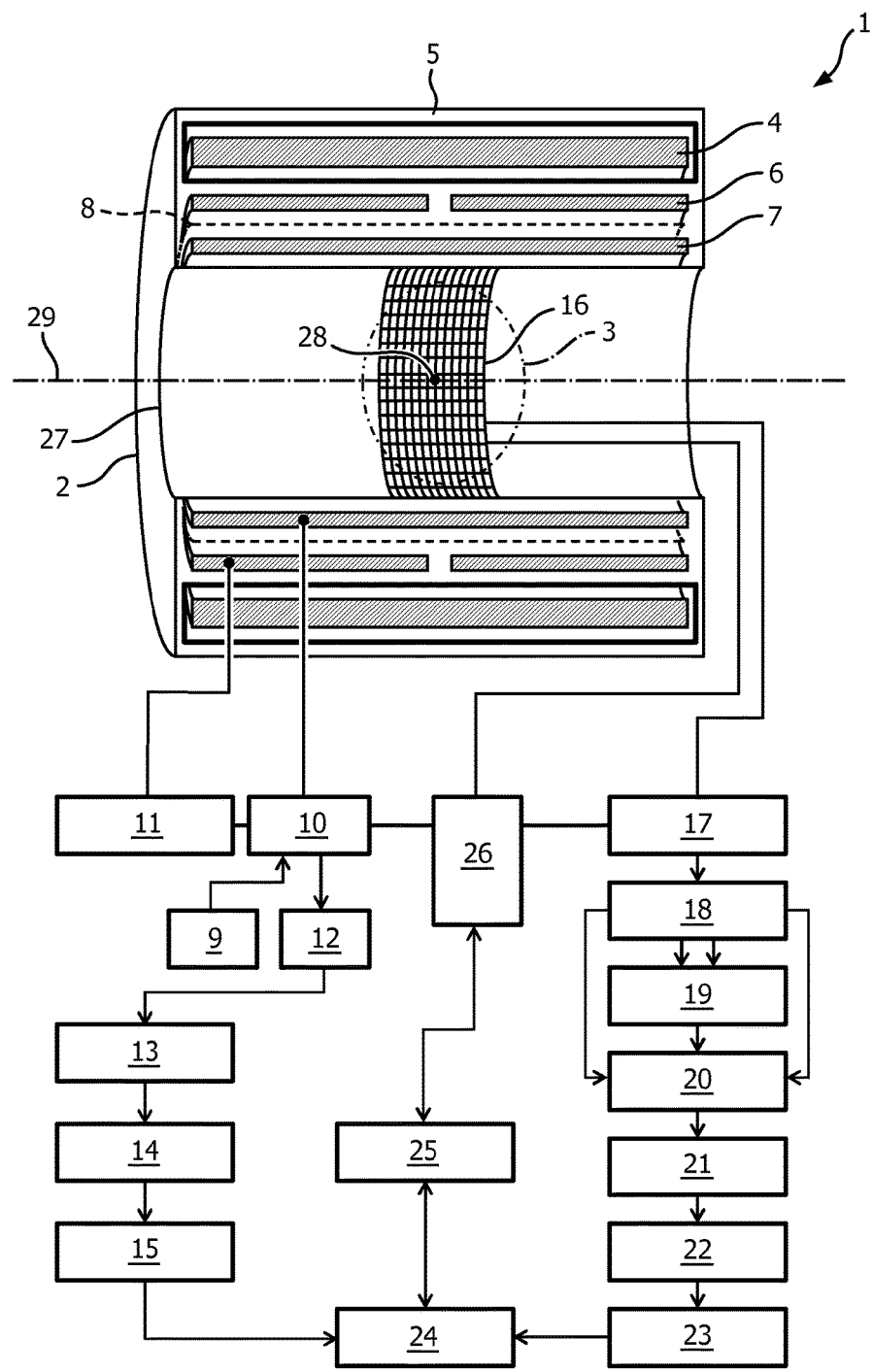
FIG. 1 illustrates a prior art fully-integrated combined MR-PET imaging assembly.

FIG. 1 illustrates a prior art fully-integrated combined MR-PET imaging assembly. With reference to FIG. 1, combined MR-PET imaging assembly 1 comprises a common scanner housing 2 with a bore 27 that defines an imaging region 3 within which a subject to be imaged such as a human or animal may be located. A main magnet 4 associated with the MR imaging system is surrounded by cryoshielding 5 and generates a main magnetic field in imaging region 3. The main magnet 4 has an isocentre 28 and a longitudinal axis 29 which passes through the isocentre 28 and is aligned with the axis of the bore 27. Magnetic gradient field coils 6 are arranged on or in the housing 2 to generate additional magnetic fields to superimpose upon the main magnetic field in imaging region 3. The magnetic gradient field coils 6 typically include coils for producing three orthogonal magnetic field gradients. In some embodiments a whole-body RF coil 7 with an RF screen 8 is arranged in or on the housing 2 in order to inject RF excitation pulses into the imaging region 3. In other embodiments local coils not shown are used to inject RF pulses local to the subject being imaged.

During MRI image acquisition an RF transmitter 9 is coupled to the whole body coil 7 via RF switching circuitry 10 or coupled to one or more local coils not shown to generate magnetic resonances in a region of the imaging region 3. A gradients controller 11 controls the signals to magnetic field gradient coils 6 in order to spatially encode the magnetic resonances. In one example, a one-dimensional magnetic field gradient applied during radio frequency excitation produces slice-sensitive excitation; magnetic field gradients applied between excitation and readout of magnetic resonances provide phase encoding, and magnetic field gradients applied during readout of magnetic of magnetic resonances provide frequency encoding. The MRI pulse sequences can be configured to produce cartesian, radial or other spatial encodings.

After the RF excitation the RF switching circuitry 10 operatively disconnects the RF transmitter 9 and connects an RF receiver 12 to the whole body RF coil 7 to acquire spatially-encoded magnetic resonances from within the imaging region 3. Alternatively the RF receiver 12 is connected to one or more of the local coils not shown. The acquired magnetic resonances are stored in MRI data buffer 13 and are reconstructed by an MRI reconstruction processor 14, resulting in a reconstructed MRI image that is stored in MRI images memory 15. The MRI reconstruction processor 14 uses algorithms such as Fast Fourier Transform (FFT) reconstruction algorithms when Cartesian encoding is used. The combined MR-PET imaging assembly 1 further includes PET imaging functionality via a plurality of gamma photon detectors 16 disposed radially around the imaging region 3 in order to receive gamma photons emitted therein. The gamma photon detectors 16 may be arranged in modules, wherein a module includes a plurality of detectors responsive to gamma photons from a predetermined capture area. Whilst in FIG. 1 the radiation detectors are illustrated within the inner lining of the MR imaging system, other configurations are also contemplated including the location of the radiation detectors within a gap in cylindrical main magnet 4. In another contemplated configuration the PET gamma photon detectors form part of a module that is removably inserted into the bore of the MR imaging system for use in pre-clinical MR-PET imaging.

In PET imaging a radiotracer is administered to a subject such as a patient or an animal prior to its positioning in the imaging region 3. The radiotracer is preferentially absorbed by regions in the subject and its distribution is imaged following an uptake period. The radiotracer undergoes radioactive decay which results in the production of positrons. Each decay event produces one positron which travels up to a few mm in human tissue where it subsequently interacts with an electron in an annihilation event that produces two oppositely-directed gamma photons. The two gamma photons each have an energy of 511 keV and are subsequently detected by the plurality of gamma photon detectors 16 disposed radially around the imaging region 3, each of which produce an electrical signal when struck by a gamma photon. In the embodiment shown in FIG. 1 the electrical signals indicative of received gamma photons are transferred to a PET events buffer located beyond the imaging region. In alternative implementations the events buffer is local to the gamma photon detectors 16 and therefore more proximal to the imaging region 3. The data in PET events buffer 17 is preferably in list mode format and includes at least information indicative of the time of reception of a plurality of gamma photons. The time information may be an absolute time or alternatively each event may be identified as a member of a pair of gamma photons that have been detected substantially simultaneously. The data may further include information indicative of the energy of the received gamma photons. Coincidence determination unit 18 in operative communication with PET events buffer 17 sorts the data into pairs of coincident events that are received substantially simultaneously. Two gamma photons are identified as coincident if their timestamps occur within a narrow time interval of each other; typically if they are detected within +/−5 ns. The positions of the two detectors receiving the coincident gamma photons define a line in space along which the annihilation event occurred, the line being termed a line of response (LOR). The pairs of coincident events from coincidence determination unit 18 are transferred to LOR processor 19 which identifies the spatial LOR along which the event occurred. In time-of-flight (TOF) PET the small time difference between the two detected events is further used to localize the position along the LOR at which the annihilation event occurred, and thus more accurately locate the spatial position of the radiotracer causing the decay event. If the absolute time of the received event is generated, optional TOF processor 20 uses the time difference between the events in each pair to more accurately locate the spatial position of the radiotracer causing the decay event. The resulting data is a PET projection data set 21 which is reconstructed by PET reconstruction processor 22 into a PET image illustrative of the distribution of the radiotracer within the imaging region using techniques such as filtered back projection and iterative reconstruction. The resulting PET image is stored in PET images memory 23. Subsequently the data from the MR and the PET imaging modalities may be processed by post reconstruction image processor 24 for example to align the images, to segment the images into different anatomical compartments, and to determine the radiotracer uptake within the compartments and the like. User interface 25 allows user interaction with the scanning process and with the post image reconstruction processor 24 for example to permit the user to align and manipulate images, to start and stop scans, to set scan parameters such as the scan time, the nature of the RF gradient fields used in the MR imaging process, and to identify the extent of the imaging region to be scanned. Combined imaging assembly 1 may further include imaging assembly activity control unit 26 which is operatively connected to portions of the both the nuclear and the MR imaging system to coordinate data acquisition from the nuclear and the MR imaging scans respectively.

In FIG. 1, at least the gamma photon detectors 16 of the PET imaging system are typically located close to the imaging region from which they receive gamma photons. Control circuitry, timing circuitry and local data processing circuitry not shown but associated with gamma photon detectors 12 may also be located close to the gamma photon detectors in order to maintain signal integrity and improve system compactness. Events buffer 17 may also be located close to the imaging region. However the operation of electronic circuitry, in particularly the modules of PET detectors 16, that are close to the bore of the MR imaging system risks that electromagnetic emissions caused by such electronic circuitry is detected by the sensitive whole body RF coil 7, or alternatively by the one or more of the local coils not shown in FIG. 1, and subsequently detected by RF receiver 12 where the interference is interpreted as a real signal. Such interference can create spurious image artefacts which degrade the resulting MR image quality. It is particularly the interference within the detection bandwidth of RF receiver 12 that causes a problem; and there may be one of more frequency intervals within which RF emissions are detected.

In order to illustrate the sensitivity of an MR imaging system to RF interference, FIG. 2 illustrates a mode spectrum of a 12-leg birdcage resonator. The vertical axis in FIG. 2 represents the reflection coefficient of the birdcage resonator, and is illustrative of the sensitivity of an example MR RF receive coil to RF interference. Three distinct frequency intervals can be identified in FIG. 2 within which interference risks detection by the RF receiver in the MR imaging system. These are from approximately 65 MHz to 85 MHz, from approximately 95 MHz to 105 MHz, and from approximately 125 MHz to 130 MHz. It is to be understood that FIG. 2 is indicative of the general principle the MR imaging system's sensitivity to interference within one or more frequency intervals, and that in general the frequencies which present a risk of interference with the MR imaging system are specific to the MR imaging system concerned and the MR RF receive coils used.

FIG. 3 illustrates the impact of interference within a sensitive frequency interval of the MR imaging system on MR image quality. In FIG. 3A two interfering frequencies within the sensitive frequency interval result in two vertical lines which both coincide with the otherwise feature-free white central region of the MR image. This central region represents the MR imaging system bore and visibly degrades image quality. In FIG. 3B a single interfering frequency results in a single vertical line in the right-hand portion of the MR image beyond the bore of the MR imaging system. Such features degrade image quality and likewise confound image analysis and are desirably removed.

One source of interference to an MR imaging system in a combined nuclear-MR imaging system is RF emissions from the nuclear imaging system. The nuclear imaging system typically includes a plurality of detector that are combined together in modules to capture nuclear decay events from an imaging region. In a PET imaging system for example the imaging region is surrounded radially by modules of gamma photon detectors, each of which receive gamma photons from a portion of the imaging region. In SPECT the gamma photon detectors are typically arranged in modules to form one or more planar arrays which are oriented toward the imaging region in order to receive gamma photons. In both cases the modular arrangement permits the sharing of common electronic circuitry, such as timing and control circuitry. The control and timing circuitry in each module is typically governed by a clock signal which conventionally operates at a fundamental frequency that is close to one or more frequency intervals that are detected by the MR RF receive circuitry. Such frequencies therefore interfere with the MR imaging system and degrade image quality. Furthermore, harmonics of the fundamental frequency are also radiated by each module, and these harmonics which fall within a frequency interval that is detected by the MR RF receive circuitry also present a risk to MR image quality. Conventionally the modules are all controlled by a common clock in order to synchronize the timing of operations performed by the modules. In a known solution to reducing such interference the modules are clocked at a common frequency which is outside the frequency interval detected by the MR RF receive circuitry. The use of a common clock assists in maintaining control of such interference frequencies and their harmonics. However this known solution to avoiding interference has the drawback of forcing the nuclear imaging system to operate at a sub-optimal clock frequency, which can degrade the nuclear imaging system's performance.

The inventors of the present invention have discovered an alternative solution in which by clocking one or more of the modules of the nuclear imaging system at a clock frequency that is shifted in at least one of phase or frequency with respect to a reference clock signal, interference between the nuclear imaging system and the MR imaging system can be significantly reduced.

Figure 4:
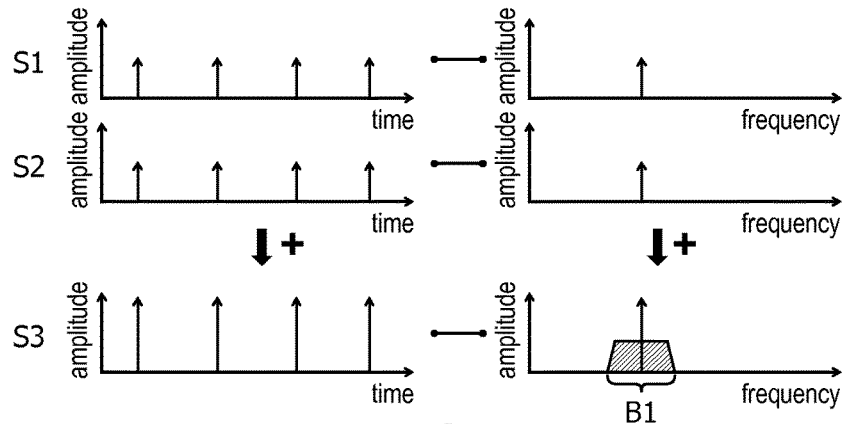
FIG. 4 illustrates the addition of two in-phase and same-frequency signals S1 and S2 in the time domain to produce signal S3, together with their respective frequency domain representations.

The combined effect of interference from a plurality of interference-generating modules can in general be described by the addition of their individual interference signals in the time domain. Consequently when modules are clocked by clock signals that are in-phase or have the same frequency, their RF emissions add constructively. This is illustrated by FIG. 4 which illustrates the addition of two in-phase and same-frequency signals S1 and S2 in the time domain to produce signal S3, together with their respective frequency domain representations. For simplicity only the fundamental frequencies of the pulsed time-domain waveforms are shown, although the principle applies likewise to the harmonics of these fundamental frequencies. The principle is also applicable to other signals in addition to S1 and S2 that are present. A frequency interval B1 represents a band of frequencies to which a nearby MR imaging system is sensitive. As indicated in FIG. 4, the time domain waveforms sum linearly to generate S3 whose amplitude is equal to the sum of the amplitudes of S1 and S2. In the frequency domain the fundamental frequencies of S1 and S2, which are both within frequency interval B1, overlap to produce S3 which has the same frequency and double the amplitude. Since the frequency of S3 is still within frequency interval B1 to which the MR imaging system is sensitive, they interfere with the MR imaging system.

In accordance with the present invention a reference clock signal is used to generate shifted clock signals for clocking the modules in which at least one shifted clock signal is shifted in at least one of phase or frequency with respect to the reference clock signal. When the shifted clock signals are summed in the time domain there is a degree of destructive interference which operates to reduce the combined effect of their interference. Consequently the total interference, as compared to the situation when all modules are clocked by a same-phase and same frequency clock signal, is reduced.

Figure 5:
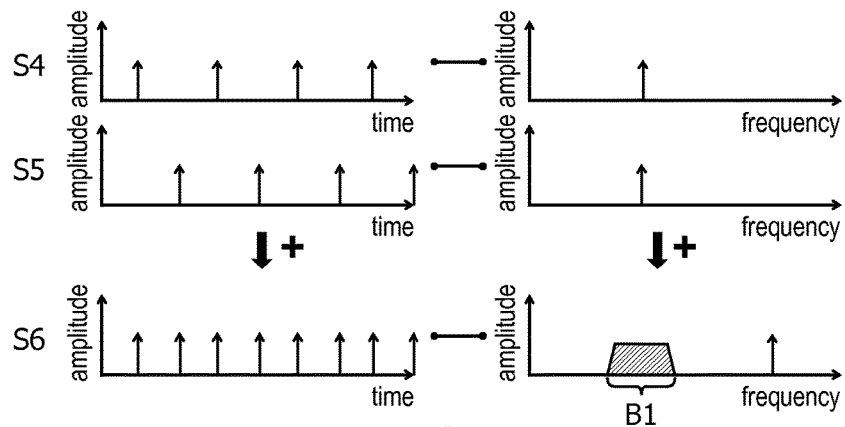
FIG. 5 illustrates a combined signal S6 which results from the addition of same-frequency signals S4 and S5 which are both within the frequency interval B1 to which the MR imaging system is sensitive, but have a mutually differing phase.

FIG. 5 illustrates a combined signal S6 which results from the addition of same-frequency signals S4 and S5 which are both within the frequency interval B1 to which the MR imaging system is sensitive, but have a mutually differing phase. In FIG. 5 the mutual phase difference of S4 and S5 is 180 degrees and results in a combined frequency of S6 which is at twice the reference frequency of S4 and S5 and is outside the frequency interval B1, which consequently reduces the interference. FIG. 5 illustrates a specific case of two sources S4 and S5 having equal magnitude but the principle of adjusting the phase of at least one source in order to reduce the degree of constructive interference is more broadly applicable. In principle the use of a 180 degree phase shift for only one of a plurality of sources results in a frequency spectrum with a spectral component at the fundamental frequency, and thus within B1, in combination with a new spectral component that is not present in the reference frequency spectrum at twice the fundamental frequency. The new spectral component at twice the fundamental frequency represents the transfer of some of the interference energy to frequencies that were not present in the reference spectrum, thus to frequencies that would not be present when in-phase and same-frequency clock signals are combined. More generally, interference is reduced in the first instance because of the spreading of the combined frequency spectrum across a range of frequencies which reduces the total spectral density of the interference. Even if the new spectral component lies within the frequency interval B1, interference will still be reduced as compared to the situation when the frequencies S1, S2 are in-phase and at the same frequency because the effect of spreading the energy over a broader range of frequencies is to introduce some variability to the measured interference which allows for its cancellation when averaged over time. In effect the phase shift breaks the continuity of the pulse stream. In the second instance it can be further arranged that the new spectral component that was not in the reference frequency spectrum lies at a frequency that is outside the frequency interval B1. Interference to an MR imaging system that is sensitive to frequency interval B1 will be further reduced under this additional condition because the MR imaging system is not sensitive to the new spectral component at all. Furthermore, whilst a frequency shift of 180 degrees is preferable in terms of its ease of generation and the magnitude of the reduction in interference, any non-zero mutual phase shift between the source frequencies will also work in the first and the second instance by generating a new spectral component in the same manner.

Figure 6:
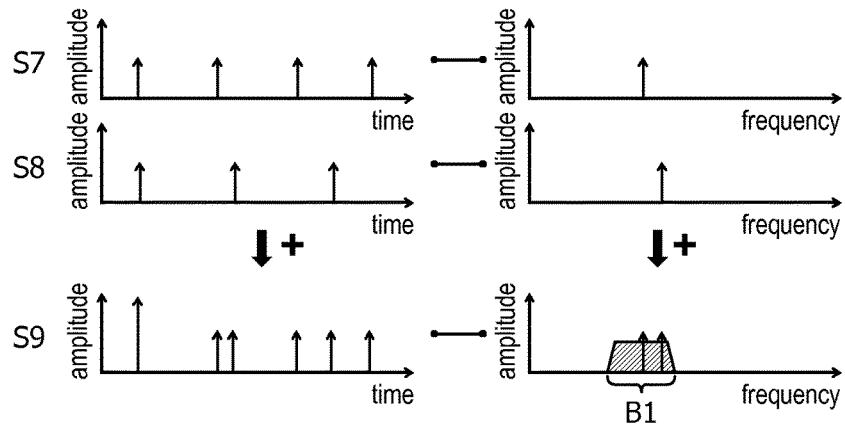
FIG. 6 illustrates a combined signal S9 which results from the addition of signals S7 and S8 which have different fundamental frequencies and which are both within frequency interval B1 to which the MR imaging system is sensitive.

FIG. 6 illustrates a combined signal S9 which results from the addition of signals S7 and S8 which have different fundamental frequencies and which are both within frequency interval B1 to which the MR imaging system is sensitive. In the example illustrated in FIG. 6 the fundamental frequencies of S7 and S8 are both present in the combined frequency spectrum. However, interference to an MR imaging system that is sensitive to frequency interval B1 is reduced because the reduced spectral density obtained by spreading the energy over a broader range of frequencies introduces some variability to the measured interference which allows for its cancellation when averaged over time. The principle illustrated in FIG. 6 occurs when there is any frequency difference amongst a plurality of RF radiating sources. Consequently interference can be reduced even is only one of a plurality of such radiation sources are operated at a different frequency to the others. Clearly the benefit is increased when the interference is spread across a broad range of frequencies and this is achieved by separating the clock frequencies of each of the interference sources, or modules, across a broad range of frequencies. Even more preferably the interference may be spread across a range of frequencies that is sufficient to ensure that the interference falls below the detectable noise floor of the MR imaging system. The above principles are used in the following embodiments of the invention.

Figure 7:
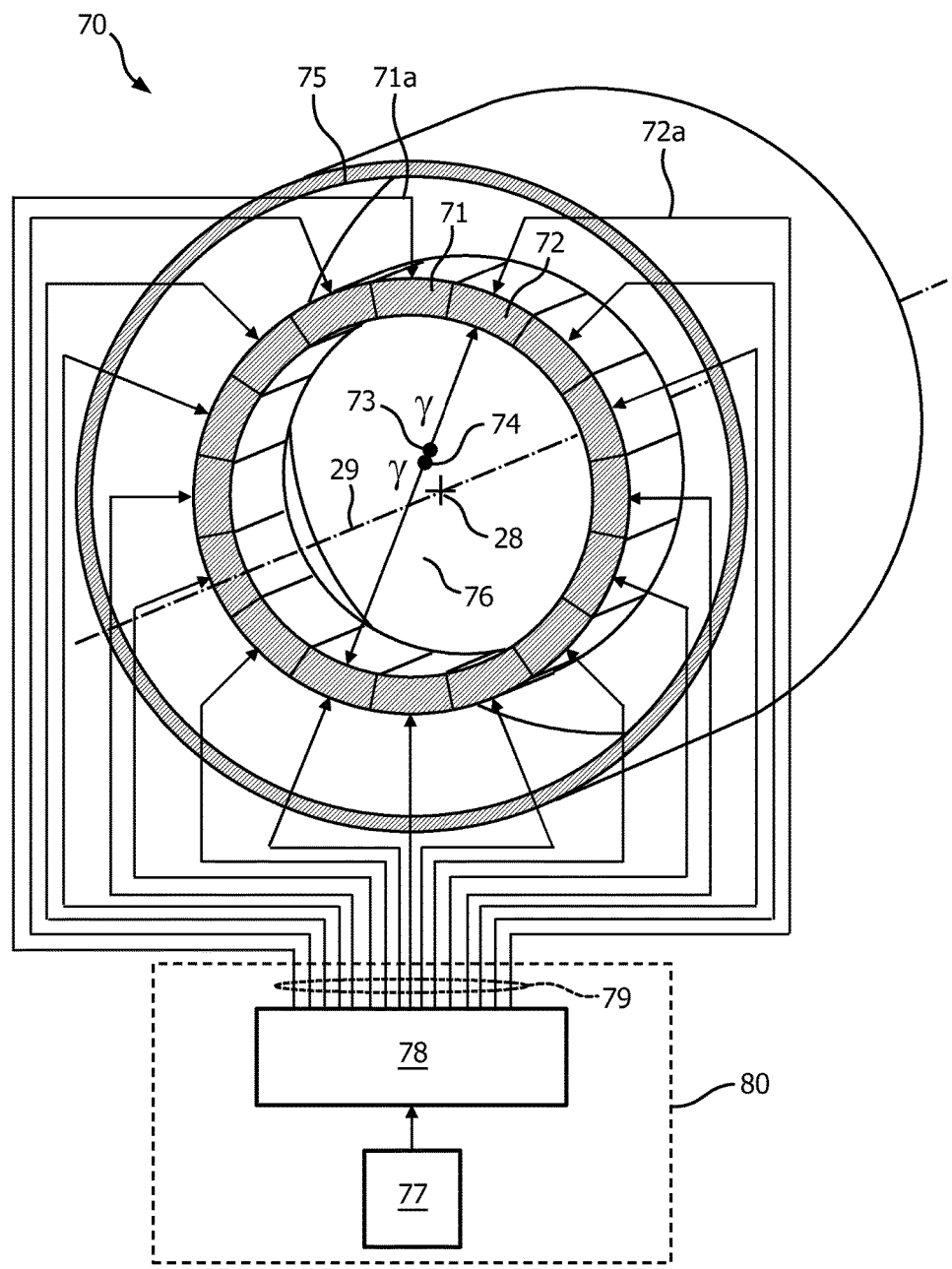
FIG. 7 illustrates a first embodiment of the invention in which components of a combined imaging assembly comprising an MR imaging system and a PET imaging system are shown.

FIG. 7 illustrates a first embodiment of the invention in which components of a combined imaging assembly comprising an MR imaging system and a PET imaging system are shown. In FIG. 7, combined imaging system 70 is formed by positioning a plurality of PET detector modules exemplified by PET detector modules 71, 72 within bore 75 of an MR imaging system. The MR imaging system has a main magnet (not shown) with an isocentre 28 and a longitudinal axis 29 which passes through the isocentre 28 and is aligned with the axis of the bore 75. PET detector modules 71, 72 are distributed radially about the MR imaging system longitudinal axis 29 in order to receive gamma photons, exemplified by pair of oppositely-directed gamma photons 73, 74 from common MR-PET imaging region 76. PET detector modules 71, 72 are each configured to receive a shifted clock signal, exemplified by shifted clock signal connection 71a, 72a. In the illustrated example of PET imaging the shifted clock signal may be used in timing the reception of gamma photons 73, 74 by PET detector modules 71, 72. Alternatively or additionally the shifted clock signal may be used by the modules for control purposes. Combined imaging assembly 70 further includes timing control unit 80, which includes reference clock unit 77 for generating a reference clock signal, and phase and or frequency shifting unit 78 which is configured to generate a plurality of shifted clock signals 79 for clocking the PET detector modules 71, 72 such that at least one of the shifted clock signals 79 is shifted respective the reference clock signal in at least one of frequency or phase. Timing control unit 80 in FIG. 7 is configured to supply a shifted clock signal to each module in the plurality of (M) modules Various configurations of the phase and or frequency shifting unit 78 are now considered for the generation of the desired phase- and or frequency-shifted signals 79. In one configuration a phase shift is introduced by using different lengths of electrical cable in the electrical signal path of a reference clock signal from reference clock unit 77. The signal delay arising from the inherent capacitance and resistance of electrical cabling can be controlled by means of the cable length in order to generate the desired phase shift or propagation delay. Such a delay may be adjusted by switching-in additional lengths of cable or additional resistive or capacitive components. The use of optical cabling is also contemplated wherein the length of an optical fiber is used to determine the signal propagation delay and consequently the phase shift. Optical phase delays have the additional benefit of improved immunity to the high magnetic fields in the MRI environment. Alternatively, dedicated hardware components including resistors and capacitors, or Field-Programmable Gate Arrays (FPGAs) may be used to generate the desired phase delay. The use of a switchable phase delay, rather than a fixed delay, clearly permits the reconfiguration of the system in order to reduce particular interference frequencies, for example during specific mode of MRI operation.

In one implementation a frequency shift is introduced to a reference clock signal from reference clock unit 77 using dedicated electronic circuitry. Suitable electronic circuitry includes a phase-locked loop (PLL), a delay-locked loop (DLL), oscillators, clock synthesizers and/or dedicated clock phase shifters, and fan-out chips for clock signals. Techniques such as clock forwarding may also be used. In another implementation the use of a re-programmable FPGA is contemplated for adjusting either the phase or the frequency. This has the benefit of being able to adjust the phase and or frequency of the shifted clock frequency relative to the reference clock unit 77. FPGAs typically include in-field-programmable DLLs or PLLs, which offer the ability to shift the reference clock signal. Furthermore, FPGAs have the capability to fan-out a plurality of clock signals, eliminating the need for external fan-out chips.

Figure 8:
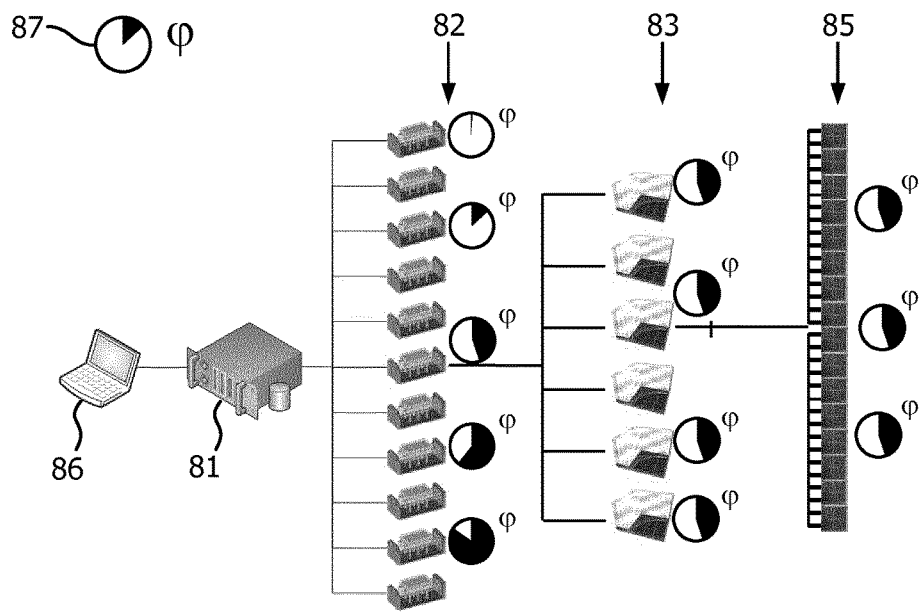
FIG. 8 illustrates a second embodiment of the invention in a digital MR-PET insert "Hyperion II$^D$".

FIG. 8 illustrates a second embodiment of the invention in a digital MR-PET insert "Hyperion II$^D$". In FIG. 8, PET detector modules 82, otherwise known as Singles Processing Units (SPUs), are distributed radially about the PET imaging region to create a so-called PET ring. PET detector modules 82 correspond to PET detector modules 71, 72 in FIG. 7. PET detector modules 82 each include several so-called detector stacks 83 which include photodetectors for the detection of scintillation light and their supply and read-out electronics. A detector stack includes silicon photomultipliers (SiPMs) 85 for the detection of gamma photon scintillation light, and the signals generated by SiPMs 85 are digitized by ASICs within the stacks. The communication between read-out ASICs and a main PET module is established using an interface layer, the so-called interface board (IF). Modules 82 forming the PET ring generate gamma photon detection data which is read-out via backbone 81 which is controlled by control PC 86. The relative clock phase in each item of FIG. 8 is indicated by item 87 ($d$)).

In operation, a fixed-frequency reference clock signal is generated by a crystal oscillator in the Backbone unit 81. This signal is communicated to PET-modules 82 by the backbone unit. The fixed frequency of the reference clock signal may be modified by a clock synthesizer within an FPGA in unit 81 that is implemented using a PLL. This signal is subsequently transmitted to each of PET-modules 82 via optical fibres.

By applying different fibre lengths or using clock phase shifters, variations of the phase between the clock signals for the PET-modules are obtained. The shifted clock signal output of the optical fibres is communicated to each of the PET-modules 82 and distributed to an FPGA located within each PET-module. Within this FPGA, a clock synthesizer having several clock outputs generates the desired shifted clock frequencies and/or phase shifts of the input clock signal, and the resulting signals are forwarded to the Stacks 83 of a PET-module. Depending on the desired overall frequency or phase shift, the clock signals to the Stacks can be further modified by routing the clock signals from the FPGA on the PET-module to the FPGAs located within each Stack, and, in turn, may be distributed to an FPGA-internal clock synthesizer for additional fine tuning of clock frequencies and phase shifts before forwarding the clock signals to the digitizing ASICs of the Stacks or directly to digital PET-sensors of the Stacks. The FPGAs on the Stacks serve as a clock fan-out unit.

Figure 9:
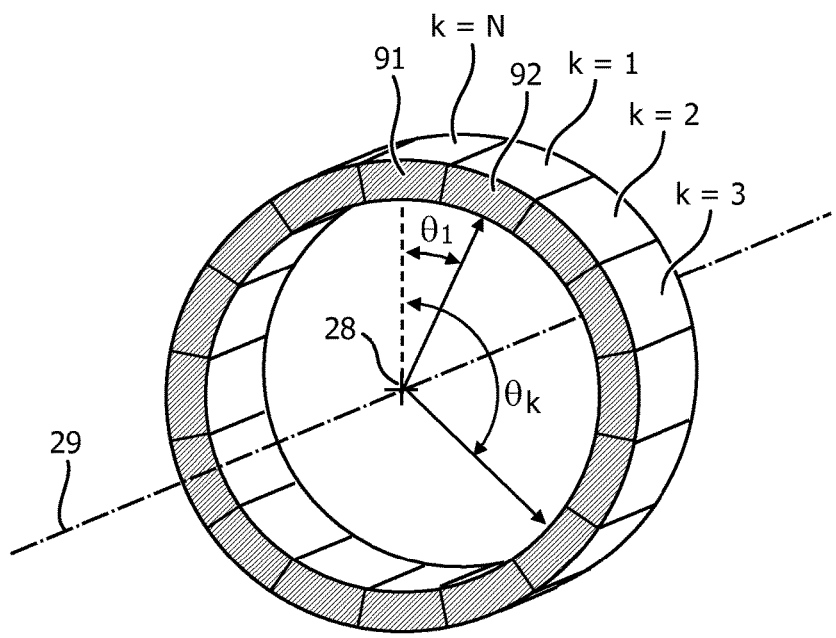
FIG. 9 illustrates a third embodiment of the invention which shows a plurality of PET detector modules (M) exemplified by PET detector modules 91, 92 that are distributed radially about longitudinal axis 29 which passes through isocentre 28 of the main magnet of an MR imaging system.

FIG. 9 illustrates a third embodiment of the invention which shows a plurality of PET detector modules (M) exemplified by PET detector modules 91, 92 that are distributed radially about longitudinal axis 29 which passes through isocentre 28 of the main magnet of an MR imaging system. Longitudinal axis 29 may further be aligned with the axis of the bore 27 of a combined MR-PET imaging assembly. In FIG. 9 there are (M) modules, and the $k^{th}$ module, where k=1 to M, lies at a rotational angle ($\theta_k$) about the MR imaging system longitudinal axis. Furthermore, the phase relationship ($\phi_k$) of the shifted clock signal received by the $k^{th}$ module respective the reference clock signal, is determined by the equation $\phi_k=\theta_k$. Consequently the phase of the shifted clock signal received by each module is determined in accordance with its rotational angle about the MR imaging system longitudinal axis. This distribution of phase with rotational angle has been found to be particularly beneficial in reducing interference between modules because it operates to shift the spectral components resulting from the time domain summation of the interfering signals radiated by the modules to higher frequencies. This reduces the probability of the overlap between the spectral components and the frequency interval within which the MR imaging system is sensitive to interference, thereby reducing interference to the MR imaging system. In another configuration it is contemplated that the (M) modules of the third embodiment are located at equally-spaced rotational angles about the MR imaging system longitudinal axis. In this configuration the phase relationship ($\phi_k$) of the shifted clock signal received by the $k^{th}$ module respective the reference clock signal, where k=1 to M, is determined in accordance with the equation $(I)_k=(360 \text{ degrees}/k)$. Such a configuration has been found to provide reduced interference with the MR imaging system, because it likewise shifts the spectral components resulting from the time domain summation of the interfering signals radiated by the modules to higher frequencies. Moreover, with this specific configuration the summation of all signals in the time domain results in a multiplication of the resulting overall signal frequency which is M times larger than the frequency of one single module. Thus the resulting interference signal has a spectrum with spectral components that are distant from the frequency interval to which the MR imaging system is sensitive.

In a fourth embodiment of the invention described with reference to FIG. 9, the MR imaging system further includes an MR RF receive coil configured to detect circularly polarized RF radiation respective to the MR imaging system's longitudinal axis (29). Furthermore, a time domain summation of the plurality of (M) shifted clock signals has a circularly polarized phase whose direction opposes the phase direction of the circularly polarized RF radiation detected by the MR RF receive coil. The phase of the time domain summation of the plurality of (M) shifted clock signals may be configured to generate such a circularly polarized phase by adjusting the phase of each of the (M) modules based on their rotational position about longitudinal axis 29. In one configuration this may be achieved by arranging that the shifted clock signal received by the $k^{th}$ module has a phase delay ($\phi_k$) respective the reference clock signal that increases in a circular direction that is counter to the phase direction of the circular polarization detected by the MR RF receive coil.

Figure 10:
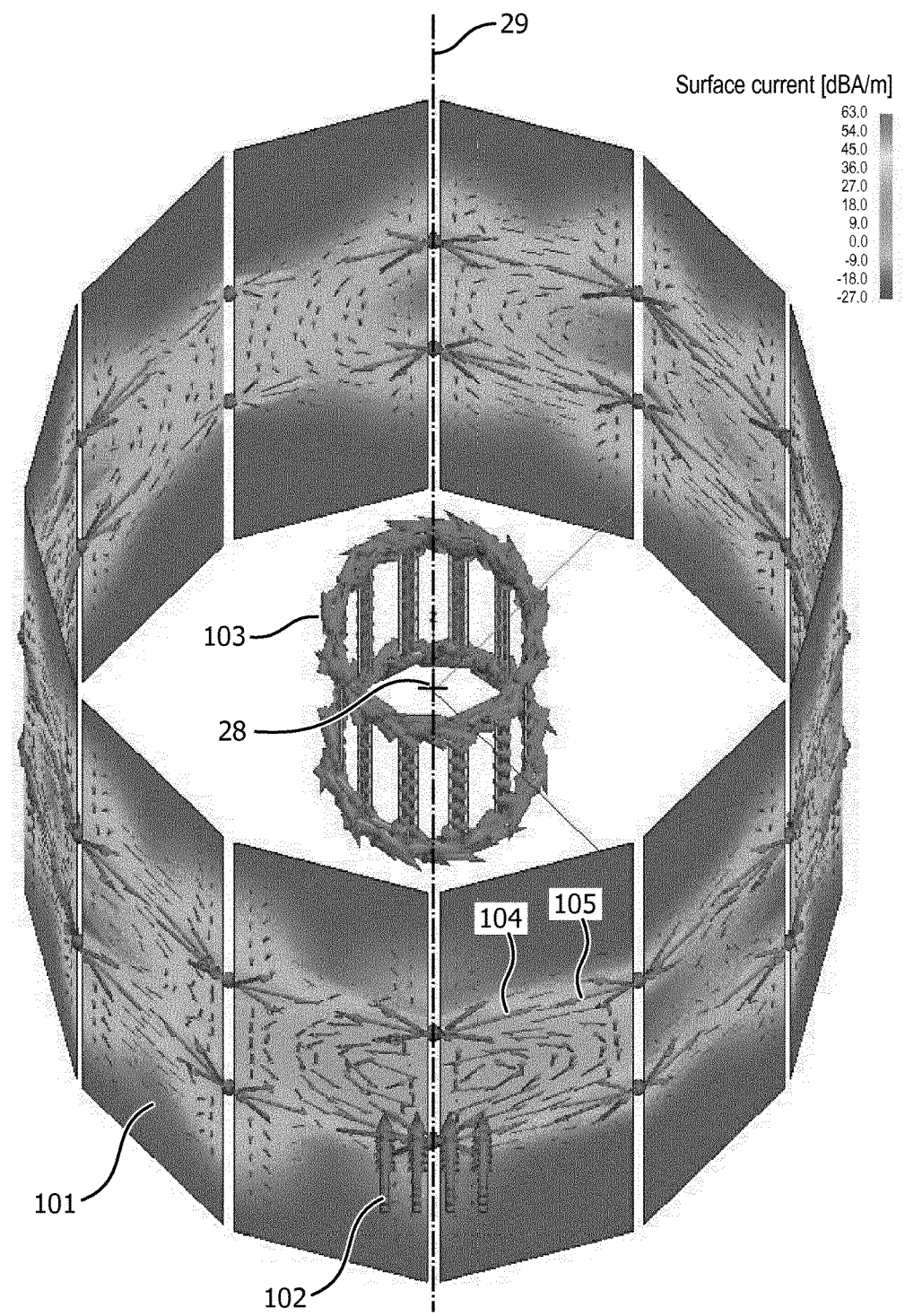
FIG. 10 illustrates a simulation of the surface current (dB A/m) induced in a segmented 12-element RF screen 101 by RF current source 102 that is positioned radially outside screen 101, and the current induced in a 12-leg birdcage MR RF receive coil 103 positioned radially inside screen 101

In order to demonstrate further embodiments of the invention, FIG. 10 illustrates a simulation of the surface current (dB A/m) induced in a segmented 12-element RF screen 101 by RF current source 102 that is positioned radially outside screen 101, and the current induced in a 12-leg birdcage MR RF receive coil 103 positioned radially inside screen 101. The four vertical arrows representing RF current source 102 are indicative of the currents generated by clock frequencies within a module, such as a PET detector module. The surface current profile indicated by the contours on RF screen 101 is indicative of the interference caused by the RF emissions from the modules. In operation the surface currents in RF screen 101 subsequently radiate RF interference which induces the currents indicated by the arrows in MR RF receive coil 103. In this way, RF radiation is communicated from an interference-generating module to the MR RF receive coil 103. The positioning of MR RF receive coil 103 within a combined imaging assembly is indicated relative to the positions of MR main magnet isocentre 28 and longitudinal axis 29 to permit comparison with FIG. 7.

In FIG. 10 the effect of RF current source 102 outside the RF screen is shown, however the simulation permits more general conclusions to be drawn about the effect of additional current sources, thus modules, that are positioned radially about longitudinal axis 29. In FIG. 10 the magnitude of current arrows 104, 105 induced in RF screen 101 would tend to be reinforced by a second identical current source positioned immediately adjacent to current source 102. This would be the situation in which an identical frequency, identical phase interference source were positioned adjacent current source 102. However if the phase of the second current source were to differ from current source 102, for example if it were in anti-phase, current arrows 104, 105 would tend to be counteracted, resulting in reduced RF emission from RF screen 101 to MR RF receive coil 103. More generally, additional modules that are positioned radially about the longitudinal axis 29 and adjacent to the modules represented by current source 102, which have a phase that is different to that of module 102 will partially cancel the interference caused by current source 102 to the MR RF receive coil 103. At least, the combined interference caused will be less than that caused by additional modules that are in-phase with current source 102. Moreover, maximum cancellation will occur when adjacent modules are in anti-phase. This can be understood by linearly superimposing the currents resulting from the two current sources on the RF screen 101. Moreover, interference will be reduced irrespective of whether the modules, represented by current source 102, are inside or outside the RF screen 102 because the RF screen would act as RF radiation sources if the modules were positioned outside the RF screen 102. Furthermore, some degree of cancellation of the currents directly induced in the MR RF receive coil 103 by current source 102 will also be achieved.

Figure 11A:
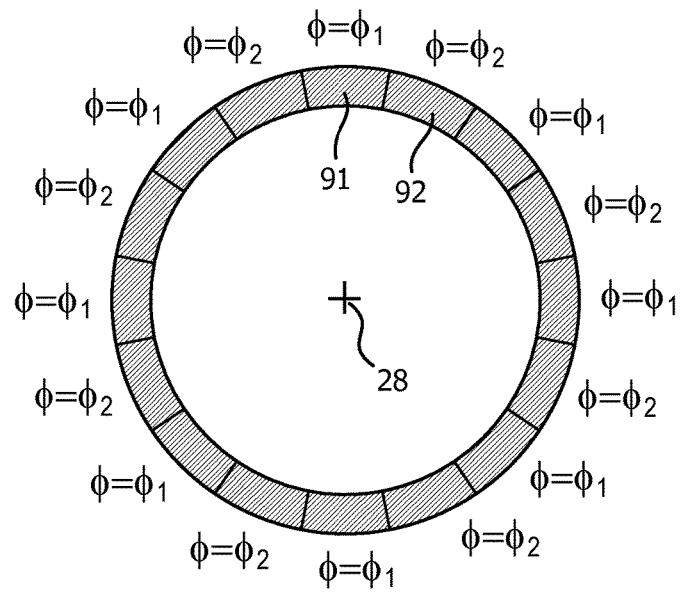
FIG. 11 illustrates a sixth embodiment of the invention in which a plurality of (M) modules are distributed radially about a longitudinal axis which passes through isocentre 28 of the main magnet of an MR imaging system.
Figure 11B:
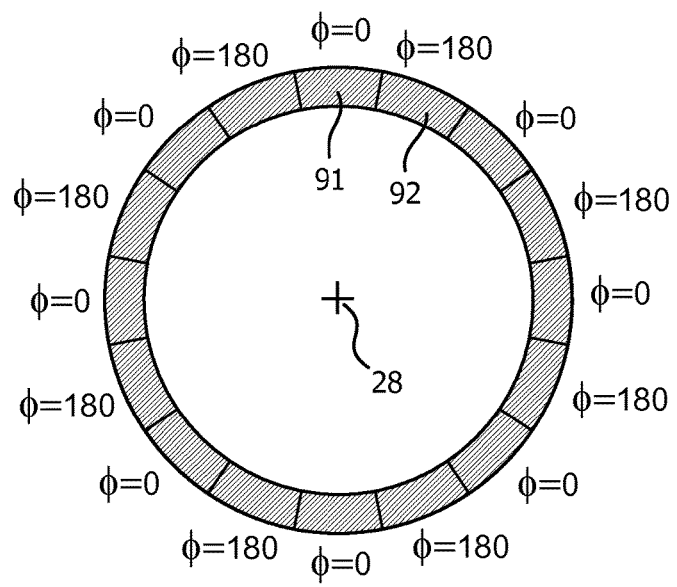

FIG. 11 illustrates a sixth embodiment of the invention in which a plurality of (M) modules are distributed radially about a longitudinal axis which passes through isocentre 28 of the main magnet of an MR imaging system. In FIG. 11 the longitudinal axis 27 passes through isocentre 28 perpendicularly to the plane of the illustration. In FIG. 11A one configuration is illustrated in which each module, exemplified by modules 91, 92, is configured to receive either a first phase relationship ($\phi_1$) clock signal or a second phase relationship ($\phi_2$) clock signal wherein the first phase relationship is different to the second phase relationship, such that adjacent modules each receive a different phase relationship clock signal. The shifted clock signals having the first phase relationship ($\phi_1$), and the second phase relationship ($\phi_2$) with the reference clock signal may be generated by the phase shifting unit 78 of FIG. 7. In FIG. 11B another configuration is illustrated in which the first phase relationship ($\phi_1$) clock signal is in anti-phase with the second phase relationship ($\phi_2$) clock signal. Beneficially, maximum reduction in interference with the MR imaging system is achieved when the first phase relationship ($\phi_1$) and the second phase relationship ($\phi_2$) are in anti-phase. In this approach the excitation of the MRI resonator is reduced by applying a phase distribution pattern on module or sub-module level to reduce the coupling integral between the MRI resonator and the interference sources represented by the modules. The coupling integral, which describes the coupling strength of the emitted field $H_P$ with the Eigen modes $H_{R,j}$ of the MRI resonator, is determined by Equations 1 and 2. The smaller the overall integral, the smaller is the potential energy transfer from external noise sources to the resonator.

$$k_{H,j} = \frac{\int dV . \vec{H}_P . \vec{H}_{R,j}}{\sqrt{\int dV |\vec{H}_P|^2} \sqrt{\int dV |\vec{H}_{R,j}|^2}}$$ Equation 1

$$k_j = k_{H,j} + k_{E,j}$$ Equation 2

Mathematically, interference can be reduced in this way by reducing the coupling constant between the interference sources, or modules, and one of the RF resonator's modes, specifically the critical mode at the proton frequency. Consequently the induced current distribution can be adjusted such that it is different to the intrinsic, characteristic current distribution of the Eigen modes of the resonator, the MR RF receive coil.

In a seventh embodiment of the invention each of the modules, for example the modules in FIG. 7, comprises a plurality of sub-modules. Such a configuration is used for example in PET imaging wherein a single module is a gamma photon detection module configured to receive radiation from a predetermined portion of the PET imaging region, and each sub-module includes one or more gamma photon detectors that detect gamma photons from a smaller portion of the PET imaging region. In one configuration a sub-module includes one or more digital Silicon Photomultiplier (SiPM) detectors, although configurations with other numbers of detectors are also contemplated. In SPECT imaging, one or more radiation detection modules may be likewise arranged in order to detect gamma photons from a smaller portion of the SPECT imaging region. The arrangement of such sub-modules into modules offers the ability to use electronic circuitry such as timing and control circuitry for several sub-modules and thereby avoid its duplication. In the seventh embodiment of the invention the relative phase of each of the clock signals for clocking each of the sub-modules is adjusted from the situation in which all sub-modules are clocked by an in-phase signal. In the seventh embodiment of the invention, each module in the plurality of (M) modules comprises an array of (N) neighboring sub-modules. The phase shifting unit is further configured to generate additional shifted clock signals for clocking each of the (N×M) sub modules; wherein the (N×M) shifted clock signals generated by the phase shifting unit include a plurality of clock signals having a first phase relationship ($\phi_1$) with the reference clock signal and a plurality of clock signals having a second phase relationship ($\phi_2$) with the reference clock signal and the first phase relationship is different to the second phase relationship. The timing control unit 80 is further configured to supply a shifted clock signal to each sub-module in the plurality of (N×M) sub-modules such that each sub-module receives either the first phase relationship ($\phi_1$) clock signal or the second phase relationship ($\phi_2$) clock signal and such that nearest neighboring sub-modules each receive a different phase relationship clock signal. A significant reduction in interference is achieved by such a spatial distribution of the phase amongst the sub-modules as will be later described with reference to FIGS. 12-14. In an alternative configuration of the seventh embodiment the first phase relationship ($\phi_1$) and the second phase relationship ($\phi_2$) are in anti-phase. Maximum reduction in interference is achieved when the first phase relationship ($\phi_1$) and the second phase relationship ($\phi_2$) are in anti-phase.

Figure 12A:
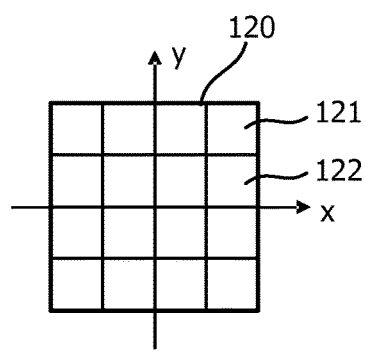
FIG. 12 illustrates two phase distribution patterns for an array of (N) neighboring sub-modules.
Figure 12B:
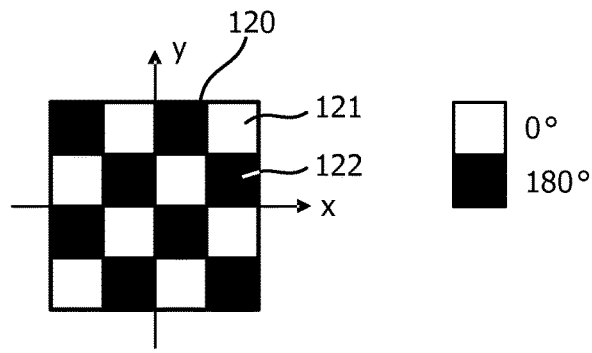

In order to demonstrate the benefits of the seventh embodiment of the invention, FIG. 12 illustrates two phase distribution patterns for an array of (N) neighboring sub-modules. In FIG. 12A a reference phase distribution pattern is shown for 16 sub-modules, exemplified by sub-modules 121, 122, which together form module 120, in which all sub-modules receive a clock signal with the same phase. FIG. 12B illustrates a phase distribution pattern for the (N) sub modules in accordance with the seventh embodiment of the invention for the specific situation in which nearest neighboring sub-modules receive clock signals that are in anti-phase.

Figure 13A:
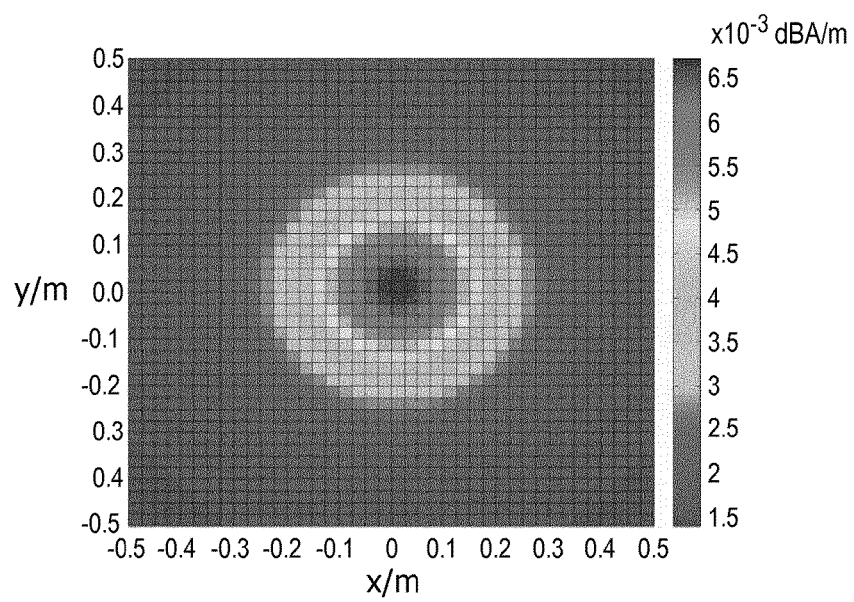
FIG. 13 illustrates simulations of the magnetic field distributions resulting from the two corresponding phase distribution patterns illustrated in FIG. 12.
Figure 13B:
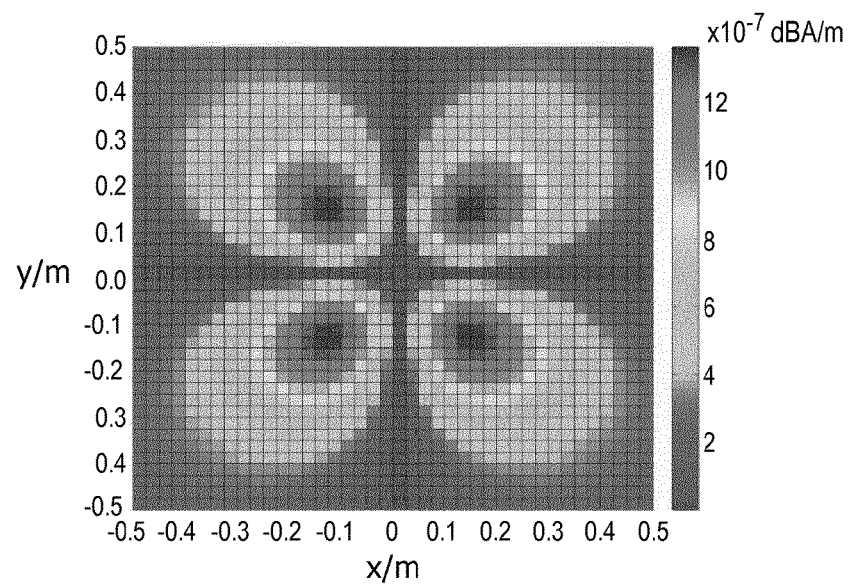
Figure 14A:
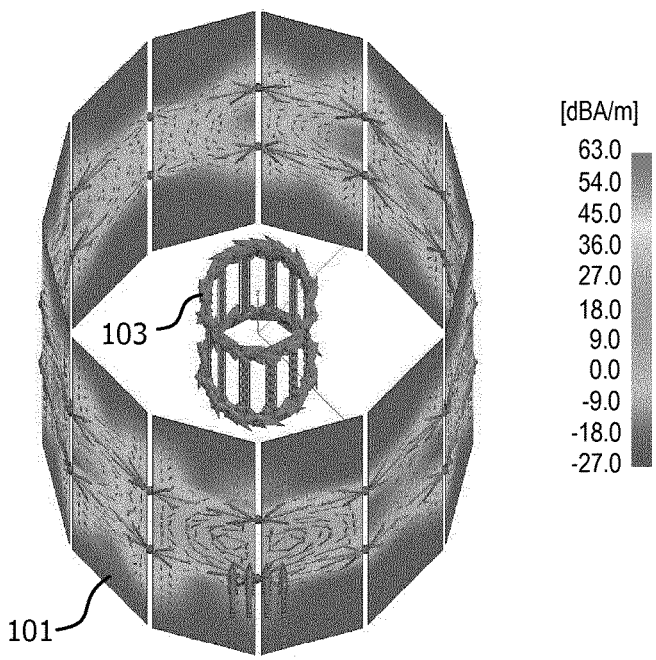
FIG. 14 illustrates simulations of the induced current distribution in an RF screen resulting from the two corresponding magnetic field distributions in FIG. 13.
Figure 14B:
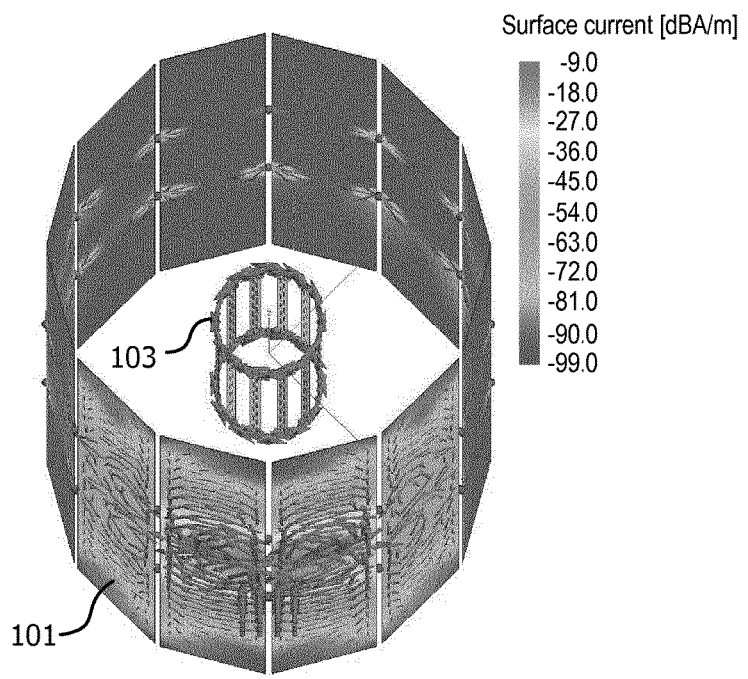

FIG. 13 illustrates simulations of the magnetic field distributions resulting from the two corresponding phase distribution patterns illustrated in FIG. 12. FIG. 13A corresponds to the magnetic field distribution in the x-y-plane, at z=30 cm, for the reference phase distribution pattern in which all modules receive an in-phase clock signal. FIG. 13B illustrates the magnetic field distribution which corresponds to the phase distribution pattern of FIG. 12B. It is noted that the absolute values simulated are specific to the simulated current, however a comparison between the simulated values is valid since the same simulated current was used in all cases. The striking reduction in magnetic field strength of nearly four orders of magnitude between FIG. 13A and FIG. 13B is noted. The resulting magnetic field strength is reduced due to compensational effects of the different radiation sources or sub-modules, and the pattern has changed from a dipole to a quadrupole field. FIG. 14 illustrates simulations of the induced current distribution in an RF screen resulting from the two corresponding magnetic field distributions in FIG. 13. FIG. 14A corresponds to the current distribution pattern of FIG. 12A, and FIG. 14B corresponds to the current distribution pattern of FIG. 12B, wherein attention is drawn to the maximum induced currents of 63 dB A/m and 9 dB A/m respectively in the MR RF resonator 103 respectively. Again, whilst the absolute values are specific to the simulated current, a comparison between the values is valid since the same simulated current was used in all cases. Thus, FIGS. 12-14 demonstrate that interference between the modules and the MR imaging system may be reduced by clocking adjacent modules with a clock signal such that adjacent modules receive clock signals that are in antiphase. This is a specific case of the more general situation in which interference with the MR imaging system may be reduced by clocking adjacent modules with clock signals that are mutually shifted in phase.

Figure 15A:
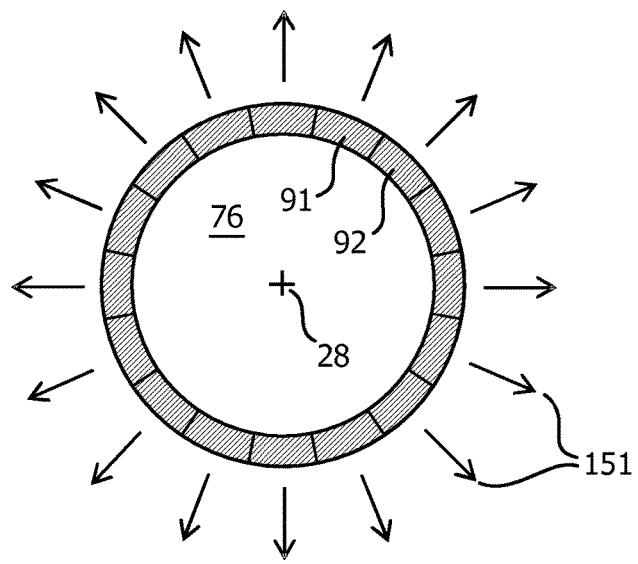
FIG. 15 illustrates an eighth embodiment of the invention in which the profile of the interference signal magnitude around the longitudinal axis of the MR imaging system's main magnet is shown.
Figure 15B:
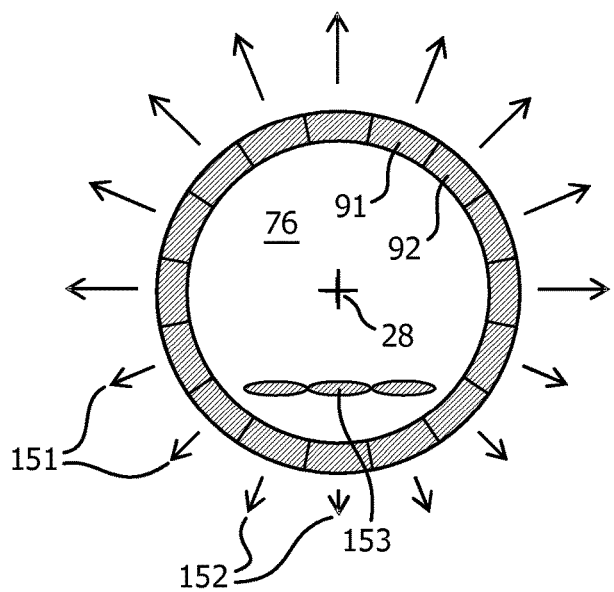

FIG. 15 illustrates an eighth embodiment of the invention in which the profile of the interference signal magnitude around the longitudinal axis of the MR imaging system's main magnet is shown. The longitudinal axis 29 of the MR imaging system's main magnet passes through its isocentre 28 in a direction perpendicular to the plane of the illustration. Common MR-PET imaging region 76, surrounded by a plurality of modules exemplified by modules 91, 92 is also shown. In FIG. 15A the interference signal has a homogeneous profile with a magnitude illustrated by means of the length of arrows 151 which is the same in all radial directions about the MR imaging system longitudinal axis. Such a configuration may be acceptable when the sensitivity profile of the MR imaging system is likewise homogeneous. However when for example RF receive coil 153 is positioned within the common MR-PET imaging region 76 it may be desirable to minimize the RF interference in specific radial directions. This is indicated by the shorter downward-pointing arrows 151 in a radial direction that passes radially through RF receive coil 153. Conversely a higher level of interference may be tolerable in other directions, such as upward-pointing directions whose arrows have a longer length. Thus it may be desirable to reduce interference in one or more radial directions. This may be at the expense of increased interference in other directions. In the eighth embodiment of the invention, each of the interference-radiating modules 91, 91 is configured so as to generate a combined interference signal that has an inhomogeneous, an anisotropic, or a non-rotationally symmetric profile about the MR imaging system longitudinal axis. The interference-generating modules may be so configured by adjusting the phase and or frequency shifts with the phase and or frequency shifting unit 78 with reference to FIG. 7 in accordance with the spatial position of each module. Such a configuration may be implemented in accordance with phased-antenna array antenna theory disclosed in publication "*Phased Array Antennas*", *2nd Edition*, Robert C. Hansen, ISBN: 978-0-470-52917-1, in order to generate one or more reduced-interference lobes in specific directions. In one configuration, modules occupying a rotational position in radial directions in which a higher level of interference is acceptable may be have zero, or small phase and or frequency shifts, whereas modules occupying a rotational position in radial directions in which a lower level of interference is desirable may have larger frequency shifts, or the relative phases of adjacent modules may be non-zero, or preferably in anti-phase. In another configuration an inhomogeneous interference signal profile may be generated by assigning the modules, or the sub-modules a relative phase in accordance with the principles of FIG. 12A and FIG. 12B. Thus, in some radial directions, interference may be reduced through the use of the chequerboard phase distribution pattern of FIG. 12B wherein nearest-neighboring modules or sub-modules have a relative phase shift of close to or equal to 180 degrees, whilst in other radial directions in which higher interference is tolerable, nearest-neighboring modules or sub-modules may receive a relative phase shift that is closer to zero degrees.

In a ninth embodiment of the invention one or more additional RF generation units are used to generate interference that nulls interference caused by one or more of the modules. With reference to FIG. 7, one or more additional RF generation units may be positioned in the combined imaging assembly in order to achieve this. The RF generation units may in one example be positioned adjacent one of the (M) modules, such as between exemplary modules 71 and 72, or alternatively there may be one or more such units in specific positions where interference is desirably reduced. In another example one or more of the modules themselves may be configured as an RF generation unit in order to maintain the rotational symmetry of the modules about the longitudinal axis 29. In order to null the interference, phase and or frequency shifting unit 78 in FIG. 7 may be configured to generate additional shifted signals which are received and radiated by the RF generation units using the principles disclosed herein. In one configuration a combined imaging assembly is disclosed which further includes at least one RF radiation generation unit that is positioned adjacent one of the (M) modules; wherein at least one of the phase shifting unit and the frequency shifting unit is further configured to generate a shifted clock signal for clocking the at least one RF radiation generation unit. Furthermore the timing control unit is further configured to supply a shifted clock signal to the RF radiation generation unit such that at least one of the phase or the frequency of the shifted clock signal received by the RF radiation generation unit is mutually shifted respective the shifted clock signal received by the adjacent module. By mutually-shifting the clock signal received by the RF radiation generation unit respective the clock signal received by the adjacent module interference resulting from the module is reduced, thereby advantageously reducing interference to the MR imaging system. Preferably the shifted clock signal for clocking the at least one RF radiation generation unit is in anti-phase with the shifted clock signal for clocking the adjacent module.

Figure 16:
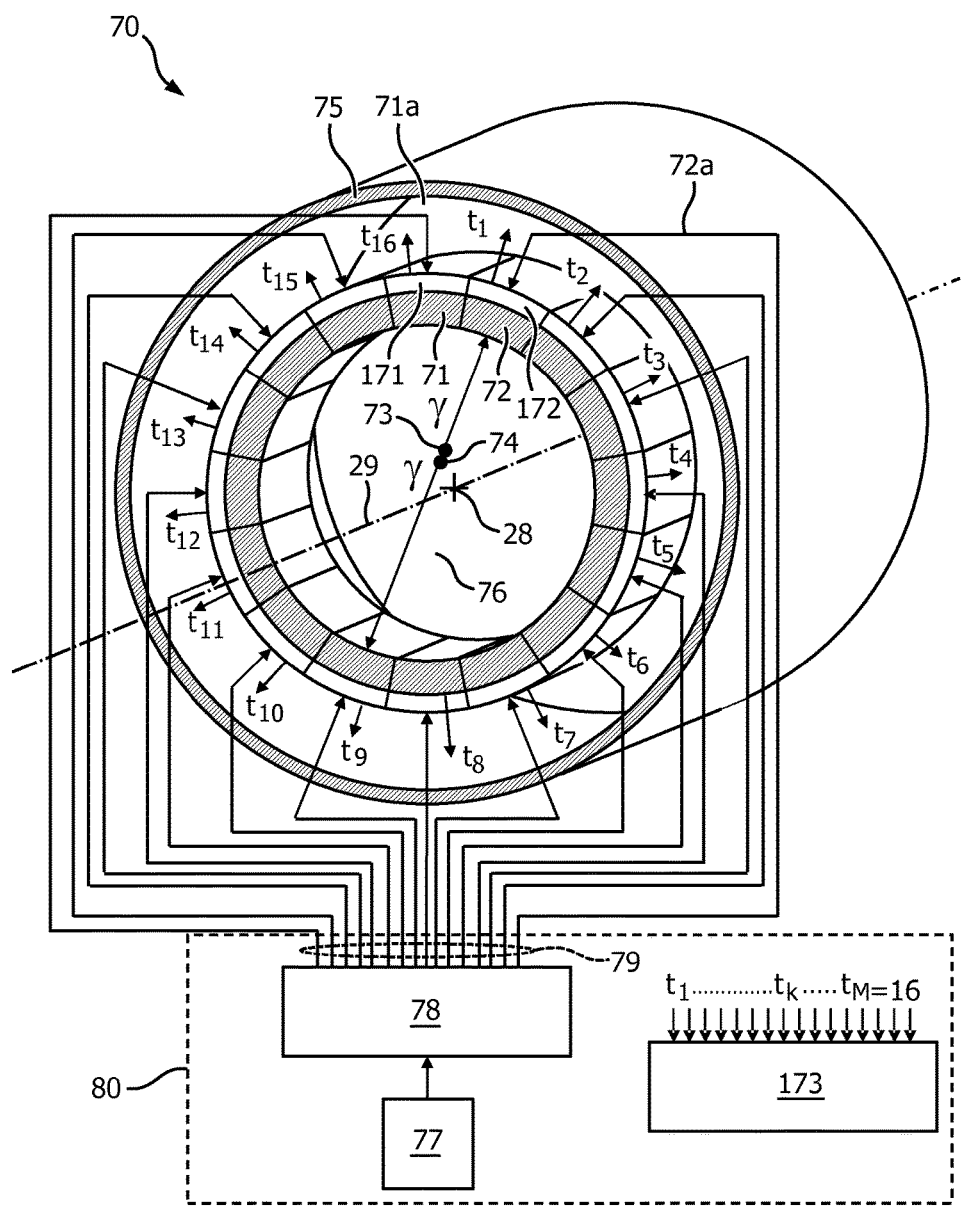
FIG. 16 illustrates an eleventh embodiment of the invention in which the nuclear imaging system is a PET imaging system and each module is a gamma photon detection module.

FIG. 16 illustrates an eleventh embodiment of the invention in which the nuclear imaging system is a PET imaging system and each module is a gamma photon detection module. Furthermore each gamma photon detection module, exemplified by gamma photon detection modules 71, 72 further includes a timestamping unit, exemplified by timestamping units 171, 172 configured to generate a timestamp indicative of the time of detection of gamma photons received by the gamma photon detection module respective the shifted clock signal 71a, 72a received by that gamma photon detection module. Timing control unit 80 further includes timing correction unit 173 which is configured to receive the timestamp, exemplified by timestamps $t_1, t_2 \ldots t_M$ from each gamma photon detection module. Timing correction unit 173 is further configured to determine, for each gamma photon detection module, corrected timestamps indicative of the time of detection of gamma photons based on the reference clock signal generated by reference clock unit 77, and at least one of i) the phase shift of the at least one shifted clock signal and ii) the frequency shift of the at least one shifted clock signal received by that gamma photon detection module. In a preferred configuration the corrected timestamp is determined in accordance with a time difference between the reference clock and the shifted clock signal 71a, 72a received by each gamma photon detection module. In one configuration the corrected timestamp is determined in software. The software may be further configured to set the desired phase and or frequency shift in phase and or frequency shifting unit 78, for example by means of an FPGA. In another configuration the corrected timestamp is determined by electronic circuitry wherein timing correction unit 173 receives a signal from the reference clock signal and from the shifted clock signal in order to determine the corrected timestamp.

Various methods for reducing interference in accordance with the invention are now disclosed. The methods are numbered numerically for ease of reference.

In a first method, a method for reducing interference to an MR imaging system in a combined imaging assembly comprising the MR imaging system and a nuclear imaging system; is disclosed wherein: the MR imaging system is responsive to signals within a predetermined frequency interval (B1); and the nuclear imaging system has a plurality (M); the method comprising the steps of: generating, from a reference clock signal, a plurality (M) of shifted clock signals wherein at least one of the (M) shifted clock signals is shifted respective the reference clock signal in at least one of frequency and phase; and clocking the (M) modules with the shifted clock signals.

In a second method, for use in combination with the first method, the reference clock signal has a frequency spectrum and a time domain summation of the plurality of (M) shifted clock signals has a combined frequency spectrum with at least one additional spectral component that is not present in the reference clock signal frequency spectrum.

In a third method, for use in combination with the second method, at least one additional spectral component lies outside the predetermined frequency interval (B1).

In a fourth method, for use in combination with the first method, the (M) shifted clock signals are mutually separated by a phase angle of 360 degrees/N. In a fifth method, for use in combination with the first method, either i) the phase shifting unit is configured to generate a plurality of (M) shifted clock signals which have a temporally-varying pseudo-random mutual phase relationship or ii) the frequency shifting unit is configured to generate a plurality of (M) shifted clock signals which have a temporally-varying pseudo-random mutual frequency relationship.

In a sixth method, for use in combination with the first method, the MR imaging system further comprises an MR RF receive coil configured to detect circularly polarized RF radiation respective to the MR imaging system's longitudinal axis; wherein a time domain summation of the plurality of (M) shifted clock signals has a circularly polarized phase whose direction opposes the direction of the circularly polarized RF radiation detected by the MR RF receive coil.

In a seventh method, for use in combination with the first method, at least one of the phase shifting unit and the frequency shifting unit is further configured to generate a shifted clock signal for clocking an RF radiation generation unit that is positioned adjacent to a module; the method further comprising the method step of clocking the RF radiation generation unit with the shifted clock signal; wherein at least one of the phase or the frequency of the shifted clock signal for clocking the RF radiation generation unit is mutually shifted respective the shifted clock signal received by the adjacent module.

In an eighth method, a timing method is disclosed for computing the time of reception of a gamma photon by a gamma photon detection module; the method comprising, in addition to the method steps of the first method; the method steps of: determining the time of detection of a gamma photon by the gamma photon detection module respective the shifted clock signal received by that gamma photon detection module; computing a time difference ($\Delta t$) between the reference clock signal and the shifted clock signal; and determining a corrected time of detection of the gamma photon based on the time of detection of the gamma photon respective the at least one shifted clock signal and the time difference ($\Delta t$).

One or more of the above method steps may be performed by a processor configured to execute instructions. The processor may be included within the combined imaging assembly or may alternatively be a standalone system. The instructions may for example be software stored on a computer program product.

In accordance with another aspect of the invention, a computer-readable medium having instructions to perform the method of any one of method steps one to eight detailed above is disclosed. The computer program product may be a computer-readable storage medium, such as a floppy disc, a magnetic hard drive, a USB drive, an optical disc, ROM or RAM and furthermore the computer executable instructions may be downloadable.

In accordance with one disclosed apparatus there is a combined imaging assembly (70) comprising an MR imaging system and a nuclear imaging system; wherein: the MR imaging system is responsive to signals within a predetermined frequency interval (B1); and the nuclear imaging system has a plurality of (M) modules (71, 72); the combined imaging assembly further comprising a timing control unit (80) having a reference clock unit (77); and at least one of a phase shifting unit and a frequency shifting unit (78); wherein at least one of the phase shifting unit and the frequency shifting unit (78) is configured to receive a reference clock signal from the reference clock unit (77) and to generate a plurality of (M) shifted clock signals (79) for clocking the (M) modules (71, 72) such that at least one of the (M) shifted clock signals is shifted respective the reference clock signal in at least one of frequency or phase; and wherein the timing control unit (80) is configured to supply a shifted clock signal to each module in the plurality of (M) modules (71, 72).

In accordance with one disclosed method there is a method for reducing interference to an MR imaging system in a combined imaging assembly (70) comprising the MR imaging system and a nuclear imaging system; wherein: the MR imaging system is responsive to signals within a predetermined frequency interval (B1); and the nuclear imaging system has a plurality (M); the method comprising the steps of: generating, from a reference clock signal, a plurality (M) of shifted clock signals wherein at least one of the (M) shifted clock signals is shifted respective the reference clock signal in at least one of frequency and phase; and clocking the (M) modules with the shifted clock signals.

To summarize, a combined imaging assembly in which an MR imaging system is combined with a nuclear imaging system such as a PET imaging system or a SPECT imaging system has been described. The nuclear imaging system has a plurality of (M) modules; and the combined imaging assembly further comprises a timing control unit having a reference clock unit; and at least one of a phase shifting unit and a frequency shifting unit. At least one of the phase shifting unit and the frequency shifting unit is configured to receive a reference clock signal from the reference clock unit and to generate a plurality of (M) shifted clock signals for clocking the (M) modules such that at least one of the (M) shifted clock signals is shifted respective the reference clock signal in at least one of frequency or phase. In so doing, reduced interference between the modules of the nuclear imaging system and the MR imaging system is obtained.

Whilst the invention has been illustrated and described in detail in the drawings and foregoing description, such illustrations and description are to be considered illustrative or exemplary and not restrictive; the invention is not limited to the disclosed embodiments and can be used for reducing interference between the modules of a nuclear imaging system and an MR imaging system in general.

The invention claimed is:

1. A combined imaging assembly comprising an MR imaging system and a nuclear imaging system; wherein:
   the MR imaging system is responsive to signals within a predetermined frequency interval; and
   the nuclear imaging system has a plurality of nuclear detector modules;
   the combined imaging assembly further comprising a timing control unit having a reference clock unit; and at least one of a phase shifting unit and a frequency shifting unit;
   wherein at least one of the phase shifting unit and the frequency shifting unit is configured to receive a reference clock signal from the reference clock unit and to generate a plurality of shifted clock signals for clocking the nuclear detector modules such that at least one of the shifted clock signals is shifted respective the reference clock signal in at least one of frequency or phase; and
   wherein the timing control unit is configured to clock each module in the plurality of nuclear detector modules with a shifted clock signal such that two or more of the shifted clock signals that clock the nuclear detector modules are mutually shifted in at least one of frequency or phase, and such that a combined effect of interference of the shifted clock signals on the MR imaging system is reduced compared to clocking all nuclear detector modules with the same clock signals.

2. A combined magnetic resonance (MR) and nuclear imaging assembly comprising:
   a MR imaging system having an isocenter with a longitudinal axis passing through the isocenter, the MR imaging system being responsive to signals within a predetermined frequency interval;
   a nuclear imaging system including a plurality of nuclear detector modules distributed radially about the MR imaging system longitudinal axis such that a $k^{th}$ module, where k=1 to M, lies at a rotational angle about the MR imaging system longitudinal axis;
   a reference clock configured to generate a reference clock signal;
   at least one of a phase shifter and a frequency shifter configured to receive the reference clock signal from the reference clock and to generate a plurality of shifted clock signals for clocking the nuclear detector modules such that at least one of the shifted clock signals is shifted respective the reference clock signal in at least one of frequency or phase, one of the shifted clock signals being to each module of the plurality of nuclear detector modules such that two or more of the shifted clock signals supplied to the nuclear detector modules are mutually shifted in at least one of frequency or phase; and
   wherein at least one of:
   the phase relationship of the shifted clock signal received by the $k^{th}$ module respective the reference clock signal, is determined by the equation $\phi k=\theta k$, or
   the detector modules are at equally spaced rotational angles and the phase relationship of the shifted clock signal received by the $k^{th}$ module respective the reference clock signal is determined in accordance with the equation $\phi k=(360\ degrees/k)$, where k=1 to M, or wherein the MR imaging system includes an MR RF receive coil configured to detect circularly polarized RF radiation respective to the MR imaging system's longitudinal axis, and a time domain summation of the plurality of shifted clock signals has a circularly polarized phase whose direction opposes the phase direction of the circularly polarized RF radiation detected by the MR RF receive coil, or
   wherein the plurality of shifted clock signals generated by the phase shifter include a plurality of clock signals having a first phase relationship with the reference clock signal and a plurality of clock signals having a second phase relationship with the reference clock signal and the first phase relationship is different to the second phase relationship, each nuclear detector module being configured to receive either the first phase relationship clock signal or the second phase relationship clock signal such that adjacent nuclear detector modules each receive a different phase relationship clock signal, or
   wherein either i) the phase shifter is configured to generate a plurality of shifted clock signals which have a temporally-varying pseudo-random mutual phase relationship or ii) the frequency shifter is configured to generate a plurality of shifted clock signals which have a temporally-varying pseudo-random mutual frequency relationship, or
   wherein either i) the phase shifter, or ii) the frequency shifter, is configured to generate a combined interference signal having a magnitude profile in a plane that is perpendicular to the MR imaging system longitudinal axis, the magnitude profile varying with rotational angle around the MR imaging system longitudinal axis in either an anisotropic or a non-rotationally symmetric manner, or
   wherein the reference clock signal has a frequency spectrum and a time domain summation of the plurality of shifted clock signals has a combined frequency spectrum with at least one additional spectral component that is not present in the reference clock signal frequency spectrum.

3. The combined imaging assembly according to claim 1 wherein the MR imaging system has an isocenter with a longitudinal axis passing through the isocenter and the plurality of nuclear detector modules are distributed radially about the MR imaging system longitudinal axis at equally-spaced rotational angles; and
   wherein the phase relationship of the shifted clock signal received by the $k^{th}$ module respective the reference clock signal, where k=1 to M, is determined in accordance with the equation $\phi k=(360\ degrees/k)$.

4. The combined imaging assembly according to claim 1 wherein the MR imaging system further comprises an MR RF receive coil configured to detect circularly polarized RF radiation respective to the MR imaging system's longitudinal axis;
   wherein a time domain summation of the plurality of shifted clock signals has a circularly polarized phase whose direction opposes the phase direction of the circularly polarized RF radiation detected by the MR RF receive coil.

5. The combined imaging assembly according to claim 1 wherein the MR imaging system has an isocenter with a longitudinal axis passing through the isocenter and the plurality of nuclear detector modules are distributed radially about the MR imaging system longitudinal axis such that the $k^{th}$ module, where k=1 to M, lies at a rotational angle about the MR imaging system longitudinal axis; and
    wherein the phase relationship of the shifted clock signal received by the $k^{th}$ module respective the reference clock signal, is determined by the equation φk=θk.

6. The combined imaging assembly according to claim 1 wherein the MR imaging system has an isocenter with a longitudinal axis passing through the isocenter and the plurality of nuclear detector modules are distributed radially about the MR imaging system longitudinal axis;
    wherein the plurality of shifted clock signals generated by the phase shifting unit include a plurality of clock signals having a first phase relationship with the reference clock signal and a plurality of clock signals having a second phase relationship with the reference clock signal and the first phase relationship is different to the second phase relationship; and
    wherein each nuclear detector module is configured to receive either the first phase relationship clock signal or the second phase relationship clock signal such that adjacent nuclear detector modules each receive a different phase relationship clock signal.

7. The combined imaging assembly according to claim 1 wherein each module in the plurality of nuclear detector modules comprises an array of neighboring sub-modules; and
    wherein the phase shifting unit is further configured to generate additional shifted clock signals for clocking each of the sub modules;
    wherein the shifted clock signals generated by the phase shifting unit include a plurality of clock signals having a first phase relationship with the reference clock signal and a plurality of clock signals having a second phase relationship with the reference clock signal and wherein the first phase relationship is different to the second phase relationship; and
    wherein the timing control unit is further configured to supply a shifted clock signal to each sub-module in the plurality of sub-modules such that each sub-module receives either the first phase relationship clock signal or the second phase relationship clock signal and such that nearest neighboring sub-modules each receive a different phase relationship clock signal.

8. The combined imaging assembly according to claim 7 wherein the first phase relationship and the second phase relationship are in anti-phase.

9. The combined imaging assembly according to claim 1 wherein either i) the phase shifting unit is configured to generate a plurality of shifted clock signals which have a temporally-varying pseudo-random mutual phase relationship or ii) the frequency shifting unit is configured to generate a plurality of shifted clock signals which have a temporally-varying pseudo-random mutual frequency relationship.

10. The combined imaging assembly according to claim 1 wherein the MR imaging system has an isocenter with a longitudinal axis passing through the isocenter; and
    either i) the phase shifting unit or ii) the frequency shifting unit, is configured to generate a combined interference signal having a magnitude profile in a plane that is perpendicular to the MR imaging system longitudinal axis; wherein the magnitude profile varies with rotational angle around the MR imaging system longitudinal axis in either an anisotropic or a non-rotationally symmetric manner.

11. The combined imaging assembly according to claim 1 further comprising at least one RF radiation generation unit that is positioned adjacent one of the nuclear detector modules;
    wherein at least one of the phase shifting unit and the frequency shifting unit is further configured to generate a shifted clock signal for clocking the at least one RF radiation generation unit;
    wherein the timing control unit is further configured to supply a shifted clock signal to the RF radiation generation unit such that at least one of the phase or the frequency of the shifted clock signal received by the RF radiation generation unit is mutually shifted respective the shifted clock signal received by the adjacent nuclear detector module.

12. The combined imaging assembly according to claim 11 wherein the shifted clock signal for clocking the at least one RF radiation generation unit is in anti-phase with the shifted clock signal for clocking the adjacent nuclear detector module.

13. The combined imaging assembly according to claim 1 wherein the reference clock signal has a frequency spectrum and a time domain summation of the plurality of shifted clock signals has a combined frequency spectrum with at least one additional spectral component that is not present in the reference clock signal frequency spectrum.

14. The combined imaging assembly according to claim 13 wherein the at least one additional spectral component lies outside the predetermined frequency interval.

15. The combined imaging assembly according to claim 1 wherein the nuclear imaging system is a PET imaging system and each nuclear detector module is a gamma photon detection module;
    wherein each gamma photon detection module further includes a timestamping unit configured to generate timestamps indicative of the time of detection of gamma photons received by the gamma photon detection module respective the shifted clock signal received by that gamma photon detection module;
    wherein the timing control unit further comprises a timing correction unit configured to receive the timestamps and to determine, for each gamma photon detection module, corrected timestamps indicative of the time of detection of gamma photons based on the reference clock signal and at least one of i) the phase shift of the at least one shifted clock signal and ii) the frequency shift of the at least one shifted clock signal received by that gamma photon detection module.

16. A method for reducing interference to an MR imaging system in a combined imaging assembly comprising the MR imaging system and a nuclear imaging system; wherein:
    the MR imaging system is responsive to signals within a predetermined frequency interval; and
    the nuclear imaging system has a plurality of nuclear detector modules;
    the method comprising the steps of:
    generating, from a reference clock signal, a plurality of shifted clock signals wherein at least one of the shifted clock signals is shifted respective the reference clock signal in at least one of frequency and phase, wherein the reference clock signal has a frequency spectrum and a time domain summation of the plurality of shifted clock signals has a combined frequency spectrum with at least one additional spectral component that is not present in the reference clock signal frequency spectrum; and clocking the nuclear detector modules with the shifted clock signals such that two or more of the shifted clock signals supplied to the nuclear detector modules are mutually shifted in at least one of frequency or phase.

17. The method according to claim 16 wherein the at least one additional spectral component lies outside the predetermined frequency interval.

18. A non-transitory computer-readable medium carrying instructions which when executed on a processor cause the processor to perform the method of claim 16.

19. The combined imaging assembly according to claim 5 wherein the MR imaging system further comprises an MR RF receive coil configured to detect circularly polarized RF radiation respective to the MR imaging system's longitudinal axis;
wherein the shifted clock signal received by the $k^{th}$ module has a phase delay respective the reference clock signal that increases in a circular direction that is counter to the phase direction of the circular polarization detected by the MR RF receive coil.

* * * * *